United States Patent [19]
Kumagai

[11] Patent Number: 5,896,043
[45] Date of Patent: Apr. 20, 1999

[54] LEVEL SHIFT CIRCUIT

[75] Inventor: Naoki Kumagai, Kanagawa, Japan

[73] Assignee: Fuji Electric Co., Ltd., Kawasaki, Japan

[21] Appl. No.: 08/784,219

[22] Filed: Jan. 16, 1997

[30] Foreign Application Priority Data

Feb. 10, 1989 [JP] Japan ................................. 8-021581
Jan. 17, 1996 [JP] Japan ................................. 8-005465

[51] Int. Cl.$^6$ ............................................. H03K 19/0175
[52] U.S. Cl. ............................. 326/68; 326/83; 326/17
[58] Field of Search ......................... 326/68, 70, 71, 326/73, 26, 27, 80, 17, 81, 83

[56] References Cited

U.S. PATENT DOCUMENTS

| | | | |
|---|---|---|---|
| 4,978,870 | 12/1990 | Chen et al. | 326/81 |
| 5,371,421 | 12/1994 | Kondoh et al. | 326/27 |
| 5,406,142 | 4/1995 | Nakama et al. | 326/81 |
| 5,410,266 | 4/1995 | Manley | 326/73 |
| 5,473,268 | 12/1995 | Declercq et al. | 326/81 |
| 5,684,415 | 11/1997 | McManus | 326/27 |

*Primary Examiner*—Jon Santamauro
*Assistant Examiner*—Don Phu Le
*Attorney, Agent, or Firm*—Finnegan, Henderson, Farabow, Garrett & Dunner, L.L.P.

[57] ABSTRACT

A level shift circuit includes first and second operation circuits, a bias circuit, and a current control circuit. The first and second operation circuits include high-voltage transistors and low-voltage transistors connected in series. The high-voltage transistors are controlled according to a potential at the interconnection point between the low-voltage and high-voltage transistors of opposite operation circuits. The bias circuit is provided in a one-to-one correspondence with the operation circuits and connected to the low-voltage transistors in series to activate the transistors in the stationary on state and decrease currents flowing into the transistors to a stationary current. The current control circuit connects to the bias circuit in parallel to increase the currents just after the low-level transistors are turned on to a high peak current. The low-voltage transistors are turned on/off alternately in response to the state transition of an input signal. An operation object is turned on/off according to the potential at the interconnection point between both of the transistors of the second operation circuit.

17 Claims, 15 Drawing Sheets

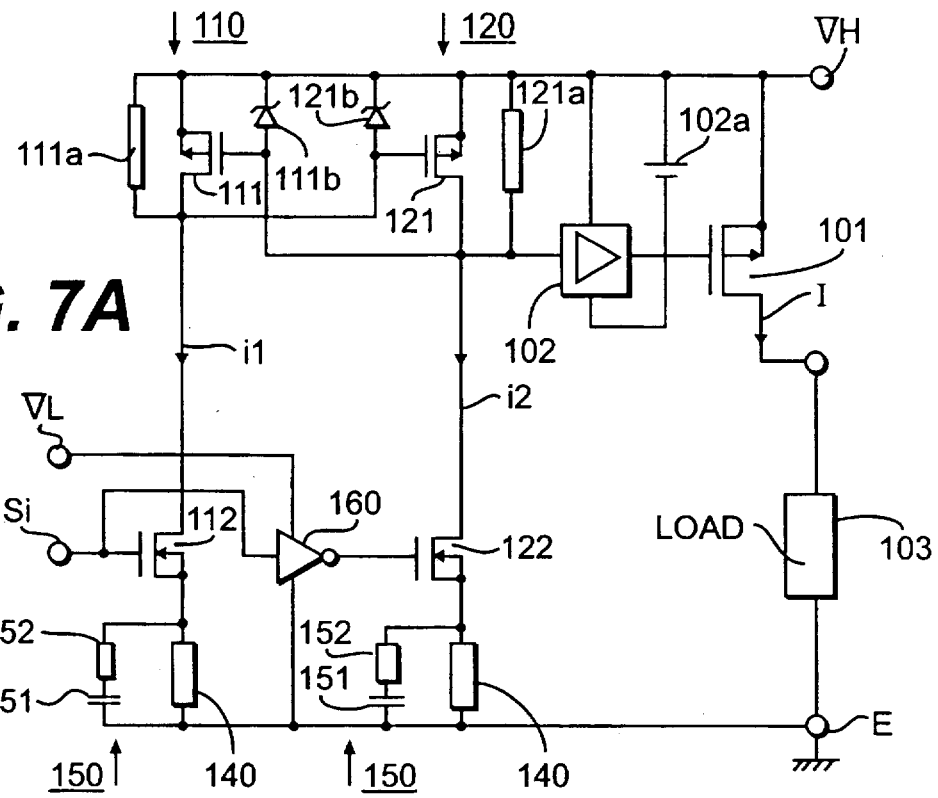
FIG. 7A
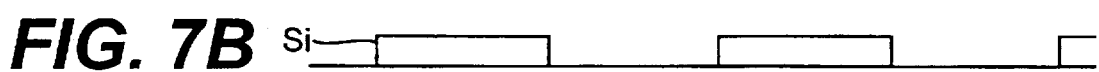
FIG. 7B Si
FIG. 7C i1
FIG. 7D i2
FIG. 7E I

LEVEL SHIFT CIRCUIT

BACKGROUND OF THE INVENTION

1. Field of the Invention

This invention relates to a level shift circuit used to operate, particularly, turn on/off operation objects of semiconductor devices or electronic circuit devices of MOS transistors, insulated bipolar gate transistors, bipolar transistors, etc., receiving a power supply voltage on the high-voltage side according to input signals on the low-voltage side.

2. Description of the Related Art

The semiconductor devices and electronic circuit devices as the operation objects need to be operated under a power supply voltage appropriate for their respective applications. Since a control system for them normally is built in an integrated circuit operating under a low power supply voltage of about 5 V, it is difficult to directly control the operation objects by output of the control system. Thus, it is necessary to place a level shift circuit to which the invention is applied between the control system and the operation object and usually the level shift circuit is built in the integrated circuit for the control system. FIGS. 1 and 2 show; examples of conventional level shift circuits fitted to the purpose.

FIG. 1 shows a circuit for operating a power MOS transistor 101 of an operation object indicated in the upper right corner of the figure by an input signal Si at a low voltage of 5–15 V shown in the lower left corner of the figure when the MOS transistor 101 operates upon reception of 300-V power supply voltage VH, for example. A drive circuit 102 of a gate of the MOS transistor 101 is provided and to operate the drive circuit 102 on the high-voltage side, for example, a 15-V floating power supply (not shown) is connected to the power supply voltage VH. The MOS transistor 101 is provided for driving a load 103 on/off.

The level shift circuit is made up of a transistor 104 for receiving the input signal Si and a voltage dividing circuit consisting of a pair of resistors 105 and 106 connected between the transistor 104 and the power supply voltage VH for turning on/off the MOS transistor 101 through the drive circuit 102 by dividing voltage by the voltage dividing circuit. When the input signal Si is high and the transistor 104 is turned on, an electric current flowing from the power supply voltage VH side causes a voltage drop to occur in the resistor 105 and the voltage drop is given to the drive circuit 102. The drive circuit 102 normally consists of a plurality of inverter stages and when receiving the voltage drop in the resistor 105 as an operation, voltage, turns on the MOS transistor 101, for example. A Zener diode 107 connected to the resistor 105 in parallel is provided to always hold the operation voltage constant and prevent an overvoltage from being applied to the input of the drive circuit 102.

In a conventional example in FIG. 2, an operation object 101 is operated. The operation object 101 is a CMOS circuit operating upon reception of high-voltage side power supply voltage VH of about 15 V by a low-voltage input signal Si of about 5 V at TTL level. Since the high-voltage side power supply voltage VH is by far lower than that in FIG. 1, the floating power supply for a drive circuit 102 is omitted. The conventional level shift circuit consists of a pair of operation circuits 110 and 120 comprising high-voltage transistors 111 and 121 and low-voltage transistors 112 and 122 connected in series for receiving the high-voltage side power supply voltage VH.

As shown in the figure, the input signal Si is given to the low-voltage transistor 112 of the operation circuit 110; a complementary signal to the input signal Si by an inverter 160 operating upon reception of 5-V low-voltage side power supply voltage VL is given to the low-voltage transistor 122 of the operation circuit 120. The high-voltage transistor 121 of the operation circuit 120 is controlled according to the potential at the interconnection point between the transistors 111 and 112 of the operation circuit 110. The high-voltage transistor 111 of the operation circuit 110 is controlled according to the potential at the interconnection point between the transistors 121 and 122 of the operation circuit 120. The drive circuit 102 of the operation object 101 is operated according to the potential at the interconnection point on the side of the operation circuit 120.

When the input signal Si is low, the low-voltage transistor 112 of the operation circuit 110 is turned off, but the low-voltage transistor 122 of the operation circuit 120 is turned on, whereby the high-voltage transistor 111 of the operation circuit 110 is turned on, whereby the high-voltage transistor 121 of the operation circuit 120 is turned off. Thus, the drive circuit 102 receives the same low operation voltage as the input signal Si. When the input signal makes the low-to-high state transition, the on/off state of each transistor of the operation circuits 110 and 120 is inverted and the drive circuit 102 receives high operation voltage. As understood from this, in the conventional example in FIG. 2, the on/off state of the high-voltage transistor becomes opposite to that of the low-voltage transistor in the stationary state, thus a current flows into neither the operation circuit 110 nor 120. A current flows only in the transient state just after the high-to-low or low-to-high state transition of the input signal Si is made, and the operation voltage that the drive circuit 102 of the operation object 101 receives is switched high/low.

However, the conventional level shift circuits as discussed above involve the following problems: In the conventional example in FIG. 1, the electric power consumed by the level shift circuit becomes easily large because of the tradeoffs with the operation speed for the operation object 101. That is, when the transistor 104 in FIG. 1 is turned on, power consumption, the product of current flowing into the transistor 104 via the voltage dividing resistors 105 and 106 and the high-voltage side power supply voltage VH, occurs. To decrease the power consumption, the resistance value of the resistors 105 and 106 may be raised for decreasing the current. However, the operation speed for the operation object 101 is restricted by a time constant, the product of the electrostatic capacity on the input side of the drive circuit 102 and the resistance value of the resistor 105. To provide a desired operation speed, the resistance value of the resistor 105 needs to be set to a predetermined limit or less. This also applies to the resistor 106 forming a part of the voltage dividing circuit like the transistor 105. Therefore, the power consumption of the level shift circuit can be decreased only to one limit and moreover increases rapidly as the high-voltage side power supply voltage VH.

In contrast, in the conventional example in FIG. 2, a current flows into the operation circuits 110 and 120 of the level shift circuit only at the beginning of the logic state transition of the input signal Si, as described above, so that power is by far less consumed than that in the example in FIG. 1. If the high-voltage side power supply voltage VH becomes several ten V or more, the circuit as in FIG. 2 cannot deal with it, but this problem can be solved if power is supplied to the drive circuit 102 from a floating power supply, such as described with regard to FIG. 1. However, the test result of operating the level shift circuit revealed that the operation speed for the operation object 101 cannot much be increased.

That is, to increase the operation speed, the electrostatic capacity on the input side of the drive circuit 102 needs to be charged and discharged rapidly. To do this, first the on resistance of the transistors 121 and 122 of the operation circuit 120 must be decreased and it is desirable that the on resistance of the transistors 111 and 112 of the operation circuit 110 are also decreased. However, if the on resistance is decreased, a so-called through current transiently flowing into the operation circuits 110 and 120 at the state transition time of the input signal Si increases. If the time for which the through current flows is prolonged due to component transistor operation time variations, etc., transistor destruction or characteristic degradation become prone to occur. As a result in the conventional example in FIG. 2, the operation speed for the operation object 101 can be increased only in a safety range in which such trouble can be prevented from occurring.

Subsequently, another conventional example will be described which shows a level shift circuit (level shifter) for converting an input signal of narrow logic amplitude in a 3-V range, for example, into an output signal of wide logic amplitude in a 30-V range, for example.

For example, a level shift circuit for converting a selection signal at a low voltage level into a liquid crystal drive voltage at a high voltage level is built in a liquid crystal drive IC (liquid crystal driver) in addition to a power transistor at an output stage. Hitherto, the basic form of this level shift circuit has been a flip-flop circuit configuration of low power consumption type wherein two stages of CMOS are connected for applying feedback, as shown in FIG. 3. That is, a level shift circuit 10 shown in FIG. 3 has a CMOS inverter INV1 for generating, for example, from a logic input signal VIN of narrow logic amplitude (3 V=Vdd–Vss) produced by a power supply in a 3-V range (0 V (=Vss) to 3 V (=Vdd)) power supply, an inverted signal VIN* of opposite phase in the 3-V range, a first n-channel MOSFET (first switch MOS) 1 for pull down, opened/closed by the logic input signal VIN, a second n-channel MOSFET (second switch MOS) 2 for pull down, opened/closed by the inverted signal VIN* exclusively with the first n-channel MOSFET 1, a first p-channel MOSFET 3 connected to the first n-channel MOSFET 1 in a totem-pole manner (in series) between 30-V (0 V (Vss) to 30 V (Vcc)) high-voltage power supplies, for example, and closed as the second n-channel MOSFET 2 is closed, and a second p-channel MOSFET 4 connected to the second n-channel MOSFET 2 in a totem-pole manner between 30-V (0 V (Vss) to 30 V (Vcc)) power supplies and closed as the first n-channel MOSFET 1 is closed.

The first p-channel-MOSFET 3 and the second p-channel MOSFET 4 make up a flip-flop FF with drain nodes (storage nodes) N1 and N2 cross-connected to mutual gates. Here, an output signal Vout of wide logic amplitude of the level shift circuit 10 is taken out from the drain node N2 and its inverted output signal Vout* appears at the drain node N1.

In the level shift circuit 10 of the basic configuration, when the logic input signal VIN rises from low level 0 V (=Vss) of narrow logic amplitude to high level 3 V (=Vdd), the first n-channel MOSFET 1 is closed, and as the inverted signal VIN* of opposite phase falls to 0 V (=Vss), the second n-channel MOSFET 2 is opened. As the first n-channel MOSFET 1 is closed, 0 V (=Vss) is fed into the drain node N1 of the flip-flop FF and the voltage is defined as low level of wide logic amplitude. As the second n-channel MOSFET 2 is opened, the voltage of the drain node N2 floats and becomes once undefined. However, the second p-channel MOSFET 4 is closed according to the defined voltage 0 V of the node N1. Thus, the drain node N2 immediately is defined as high-level voltage 30 V (=Vcc) of wide logic amplitude. As a result, the first p-channel MOSFET 3 is opened. Thus, a p-channel MOSFET 5 at an output stage with its gate connected to the drain node N2 is opened.

In contrast, when the logic input signal VIN falls from high level 3 V (=Vdd) to low level 0 V (=Vss), the first n-channel MOSFET 1 is opened and the second n-channel MOSFET 2 is closed. 0 V (=Vss) is fed into the drain node N2 of the flip-flop FF and the voltage is defined as low level of wide logic amplitude. The voltage of the drain node N1 floats and becomes once undefined. However, the first n-channel MOSFET 3 is closed according to the defined voltage 0 V of the node N2. Thus, the drain node N1 immediately is defined as high-level voltage 30 V (=Vcc) of wide logic amplitude. As a result, the second p-channel MOSFET 4 is opened. Thus, the p-channel MOSFET 5 at the output stage with is closed.

Thus, the level shift circuit 10 provides the step waveform of the logic output signal VOUT of wide logic amplitude of low level 0 V (Vss) to high level 30 V (Vcc) with respect to the step waveform of the logic input signal VIN of narrow logic amplitude of narrow logic amplitude of low level 0 V (Vss) to high level 3 V (Vdd).

The level shift circuit 10 is made monolithic as a semiconductor integrated circuit (IC) together with a preceding-stage circuit (not shown) for generating the logic input signal VIN and the MOSFET 5 at the output stage. Thus, it is desirable to form the gate insulting films of the MOSFETs in one chip all as the same thickness from cost merits by reducing the manufacturing process steps. However, since the potentials of the drain nodes (storage nodes) N1 and N2 of the flip-flop FF in the level shift circuit 10 are reset to 0 V (Vss) alternately as the switch MOSs 1 and 2 are opened and closed. Thus, the source-to-drain voltage becomes a high voltage (about 30 V) in the first and second p-channel MOSFETs 3 and 4 making up the flip-flop FF and the MOSFET 5 at the output stage. Thus, transistors of a high voltage resistance structure formed with a low-concentration drain region of offset gate type are required. Further, since high voltage (about 30 V) is also applied between gate and source, between gate and drain, and between gate and substrate, the gate insulating films of the MOSFETs 3 to 5 must be formed furthermore thick as compared with those of MOSFETs of other low-voltage control circuits for the purpose of improving the gate voltage resistance.

A level shift circuit 20 shown in FIG. 4 is proposed in order to place the gate-to-source voltage resistance, gate-to-drain voltage resistance, and gate-to-substrate voltage resistance within 3-V voltage resistance. That is, the level shift circuit 20 has a configuration wherein in the level shift circuit 10 shown in FIG. 3, the gates of the first and second p-channel MOSFETs 3 and 4 making up the flip-flop FF are connected to 30-V (Vcc) high-voltage power supply via voltage regulation diodes D1 and D2 for diode clamper.

Assuming that the Zener voltage Vz of these voltage regulation diodes D1 and D2 is about 3 V, if the first n-channel MOSFET 1 is closed, the drain node N1 does not fall below Vcc–Vz=about 27 V because of voltage clamp of the voltage regulation diode D2, and the gate-to-source, gate-to-drain, and gate-to-substrate voltages of the second p-channel MOSFET 4 are placed within 3 V. Likewise, if the second n-channel MOSFET 2 is closed, the drain node N2 does not fall below about 27 V either because of voltage clamp of the voltage regulation diode D1, and the gate-to-source, gate-to-drain, and gate-to-substrate voltages of the first p-channel MOSFET 3 are placed within 3 V. The gate-to-source and gate-to-substrate voltages of the MOSFET 5 at the output stage are also placed within 3 V. The gate voltage resistance of the MOSFET 5 at the output stage as well as the MOSFETs 3 and 4 of the flip-flop FF needs only to be 3-V voltage resistance. Since 3 V or more is applied as the source-to-drain voltages of the switch MOSs 1 and 2 and the MOSFET 5 at the output stage, high-voltage resistance MOSFETs of an offset gate structure, etc., having a low-concentration drain region (circled in FIG. 4) are used for the MOSFETs 1, 2, and 5.

By the way, in the level shift circuit 10 shown in FIG. 3, in the stable (stationary) state of the flip-flop FF, current is not consumed on the principle except leakage current of the switch MOS 1 or 2 (saturation current of p-channel MOSFET 3 or 4), and only a minute through current flows into a 2-stage series circuit in the transition process of the flip-flop FF. Therefore, low power is consumed. On the other hand, in the level shift circuit 20 shown in FIG. 4, in the process in which the first switch MOS 1 is closed, the current which should be allowed to flow into the first switch MOS 1 is such a breakdown current to cause Zener voltage Vz to occur in the diode D2 more than the saturation current flowing into the first p-channel MOSFET 3 closed in the immediately preceding stable state (write current for placing the storage node N1 in low level), and in the process in which the second switch MOS 2 is closed, the current which should be allowed to flow into the second switch MOS 2 is equal to or greater than the sum of such a breakdown current to cause Zener voltage Vz to occur in the diode D1 more than the saturation current flowing into the second p-channel MOSFET 4 closed in the immediately preceding stable state (write current for placing the storage node N2 in low level) and a charge current to charge source-to-gate capacity (gate capacity) C5 of the p-channel MOSFET 5 at the output stage. After the first switch MOS 1 shifts to the stable state of the closed state of the MOS 1, the current which should be allowed to flow into the first switch MOS 1 may be a minute current (hold current) sufficient for the diode D2 to hold the Zener voltage Vz. After the second switch MOS 2 shifts to another stable state of the closed state of the MOS 2, the current which should be allowed to flow into the second switch MOS 2 may be a minute current (hold current) sufficient for the diode D1 to hold the Zener voltage Vz.

However, in the circuit configuration in FIG. 4, after the first switch MOS 1 reaches the stable state of the flip-flop FF of the closed state, the current of the same value as that at the state transition time of the MOS 1 still continues to flow into the first switch MOS 1, and after the second switch MOS 2 reaches another stable state of the flip-flop FF of the closed state, the current of the same value as that at the state transition time of the MOS 2 still continues to flow into the second switch MOS 2. Thus, large power is consumed.

Then, the present applicant proposes a level shift circuit 30 comprising drain current variable circuits 32 and 34 shown in FIG. 5. This level shift circuit 30 has source resistors R11 and R12 in series making up a source follower circuit (constant current circuit) together with the first n-channel MOSFET 1 operating in a non-saturation region, an n-channel MOSFET 6 for changing source resistance value for short-circuiting the source resistor R12, a one-shot circuit (monostable multivibrator) 7 for applying a change time limit pulse P1 of predetermined pulse width $\Delta T1$ to a gate of the MOSFET 6 at time t1 at which logic input signal VIN rises, source resistors R21 and R22 in series making up a source follower circuit (constant current circuit) together with the second n-channel MOSFET 2 operating in a non-saturation region, an n-channel MOSFET 8 for changing source resistance value for short-circuiting the source resistor R22, and a one-shot circuit 9 for applying change time limit pulse P2 of predetermined pulse width $\Delta T2$ (=$\Delta T1$) to a gate of the MOSFET 8 at time t2 at which logic input signal VIN falls, in the level shift circuit 20 shown in FIG. 4.

The first n-channel MOSFET 1, the source resistors R11 and R12, the n-channel MOSFET 6 for changing source resistance value, and the one-shot circuit 7 make up the first drain current variable circuit 32. The second n-channel MOSFET 2, the source resistors R21 and R22, the n-channel MOSFET 8 for changing source resistance value, and the one-shot circuit 9 make up the second drain current variable circuit 34.

At the time t1 of the state transition process of the flip-flop FF at which the logic input signal VIN rises, the MOSFET 6 is held closed only for the $\Delta T1$ time as the change time limit pulse P1 occurs. Thus, only the resistor R11 serves as the source resistors of the first n-channel MOSFET 1, causing drain current ID1 flowing into the first n-channel MOSFET 1 to increase rapidly. After the expiration of the $\Delta T1$ time, the MOSFET 6 is opened and the resistor R12 is connected to the resistor R11 in series, thus the drain current ID1 flowing into the first n-channel MOSFET 1 is decreased rapidly and is restored to a minute current. At the time t2 of another state transition process at which the logic input signal VIN rises, the MOSFET 8 is held closed only for the $\Delta T2$ time as the change time limit pulse P2 occurs. Thus, only the resistor R21 serves as the source resistors of the second n-channel MOSFET 2, causing drain current ID2 flowing into the second n-channel MOSFET 2 to increase rapidly. After the expiration of the $\Delta T2$ time, the MOSFET 8 is opened and the resistor R22 is connected to the resistor R21 in series, thus the drain current ID2 flowing into the second n-channel MOSFET 2 is decreased rapidly and is restored to a minute current. Thus, the drain currents ID1 and ID2 of the first and second n-channel MOSFETs become each rapidly increased drain current IMAX in the transition process of the flip-flop FF and power-saving drain current (static mode current) IMIN in the stable state, thus contributing to the reliable state transition and reduction in power consumption.

By the way, if the level shift circuit 30 in FIG. 5 is viewed as a dynamic circuit, in the configuration in which the power p-channel MOSFET 5 at the output stage is connected to either of drain nodes N1 and N2 of the flip-flop FF, the large source-to-gate capacity C5 can be assumed to be connected to one of the nodes. Thus, the scale of the elements and signal change timing symmetry in the level shift circuit 30 are lost inevitably.

That is, as shown in FIG. 5, when the gate of the p-channel MOSFET 5 at the output stage is connected to the drain node N2, if the first n-channel MOSFET 1 is closed at the time t1 and the second n-channel MOSFET 2 is opened, the second p-channel MOSFET 4 is closed. This second p-channel MOSFET 4 is built in, the chip as a comparatively large-scale element to rapidly discharge the source-to-gate capacity C5. Thus, it is a large element as compared with the first p-channel MOSFET 3 and a source-to-gate capacity C4 that cannot be ignored is parasitic on the second p-channel MOSFET 4 inevitably.

As a result, if the second n-channel MOSFET 2 is closed at the time t2 at which the logical input signal VIN falls and the first n-channel MOSFET 1 is opened, the voltage of the drain node N1 is hard to rise because of the source-to-gate capacity C4 at the beginning and the second n-channel MOSFET 2 still remains closed. Thus, almost all of the rapidly increased drain current IMAX flowing into the second n-channel MOSFET 2 at the state transition time passes through the second p-channel MOSFET 4 as a reactive current and is hard to flow through the voltage regulation diode D1 and on resistance of the second n-channel MOSFET 2 of comparatively large element scale is low. Therefore, falling of the gate voltage of the first p-channel MOSFET 3 (voltage of drain node N2) is delayed. Thus, the MOSFET 3 is closed after a time lag and Vcc voltage it is supplied to the node N2. However, the gate voltage of the second p-channel MOSFET 4 does not immediately rise because of the discharge time of the source-to-gate capacity C4, and is opened behind the time at which the second n-channel MOSFET 2 is closed.

As shown in FIG. 6, the rapidly increased drain current IMAX flows as a reactive current Q1 at the time interval between the time t2 at which the logic input signal VIN falls and the second n-channel MOSFET 2 is closed and the time t21 at which the second p-channel MOSFET 4 is opened. Likewise, the rapidly increased drain current IMAX also flows as a reactive current q1 at the time interval between the time t1 at which the logic input-signal VIN rises and the first n-channel MOSFET 1 is closed and the time t11 at which the first p-channel MOSFET 3 is opened. However, since the gate capacity of the first p-channel MOSFET 3 can be ignored, the time interval between the time t1 and the time t11 is fairly short as compared with the time interval between the time t2 and the time t21 and the reactive current q1 is also fairly short as compared with the reactive current Q1.

When the opening time of the second p-channel MOSFET 4, t21, is reached, all the rapidly increased drain current IMAX flowing into the second n-channel MOSFET 2 at the state transition time flows effectively through the voltage regulation diode D1, thus the voltage of the drain node N2, VOUT, falls by Zener voltage VZ from the power supply voltage Vcc and charging of the source-to-gate capacity C5 is first started.

Although short-circuit discharge is a moment as the second p-channel MOSFET 4 is closed, the source-to-gate capacity C5 is charged (charge amount Q2) with a comparatively large time constant corresponding to the product of the large capacity C5 and resistance of the source follower circuit containing the second n-channel MOSFET 2. Thus, the voltage of the drain node N2, namely, the output signal VOUT falls moderately in an exponential waveform. As a result, the turn-on time of the p-channel MOSFET 5 at the output stage, TON, is prolonged and is unbalanced with the turn-off time TOFF; the p-channel MOSFET 5 at the output stage has a poor switching characteristic.

To resolve the imbalance between the turn-on time TON and the turn-off time TOFF, the element area of the second n-channel MOSFET 2 itself can be formed on a large scale as compared with the first n-channel MOSFET 1 for increasing the current capacity to further increase the rapidly increased drain current IMAX flowing into the second n-channel MOSFET 2 at the state transition time to rapidly charge the source-to-gate capacity C5 from the time t21. This leads to an increase in the chip size, causing the cost of manufacturing a semiconductor integrated circuit to rise. In addition, the following imperfections on the operation can be pointed out:

(1) If the current capacity of the second n-channel MOSFET 2 itself is increased for rapidly charging the source-to-gate capacity C5 as described above, charging of the gate capacity C5 is not started until the opening time of the second p-channel MOSFET 4, t21, is reached. Thus, the turn-on time is made longer than the turn-off time by the charge time interval t21-t23, and the switching speed is slow.

Before it, a time lag occurs by the time the second p-channel MOSFET 4 is opened because of the source-to-gate capacity C4 parasitic on the second p-channel MOSFET 4. Thus, the turn-on time is prolonged as long as the time lag as compared with the turn-off time and is unbalanced with the turn-off time.

(2) If furthermore large rapidly increased drain current IMAX' (>IMAX) is caused to flow into the second n-channel MOSFET 2 at the state transition time, as shown in FIG. 6, to rapidly charge the source-to-gate capacity C5 of the p-channel MOSFET 5 at the output stage, the rapidly increased drain current IMAX' must be previously allowed to flow as a further large current through 2-stage series circuit (reactive current) Q1' at the time interval between the time at which the second n-channel MOSFET 2 is closed (the logic input signal VIN rises), t2, and the time at which the second p-channel MOSFET 4 is opened, t21. Thus, the reactive current increases and power consumption grows.

Therefore, a trade-off exists between improvement in the switching speed by shortening the turn-on time in (1) above and reduction in the reactive current at the state transition time.

(3) Because of current value variable circuit of time limit change type, the time limit for changing from the rapidly increased drain current IMAX to the power-saving drain current IMIN (time t11, time t23) depends uniformly on the pulse width ΔT1, ΔT2 of the change time limit pulse P2 by the one-shot circuit 7, 9. If the pulse width is too short, a change is made to the decreased drain current IMIN before the voltage of the node N1, N2 rises or falls sufficiently. As a result, the rising or falling is further delayed and the transition time (turn-on time, turn-off time) is prolonged. If the pulse width is too long, the rapidly increased drain current IMAX continues to flow unnecessarily still after the voltage of the node N1, N2 rises or falls sufficiently, thus power consumption increases. In fact, however, variations in element characteristics, temperature characteristic, etc., must be considered to set the pulse width ΔT1, ΔT2 on the long side. Therefore, power consumption grows at the state transition time.

SUMMARY OF THE INVENTION

The present invention has been made in view of the above circumstances, and therefore a first object of the invention is to provide a level shift circuit that can operate an operation object at high speed with the amount of power consumed being as small as possible.

A second object of the invention is to provide a level shift circuit that can improve the switching speed of an output stage transistor.

A third object of the invention is to provide a level shift circuit that can suppress the rapidly increased current which should be allowed to flow at the state transition time to the minimum necessity, thereby decreasing power consumption.

A fourth object of the invention is to provide a level shift circuit that can suppress the supply period of the rapidly increased current which should be allowed to flow at the state transition time to the minimum necessity, thereby decreasing power consumption.

In order to solve the above problems, according to the invention, there is provided a level shift circuit comprising a first operation circuit and a second operation circuit each having low-voltage and high-voltage transistors connected in series for controlling an on/off state of the high-voltage transistor of each operation circuit according to a potential at an interconnection point between the low-voltage and high-voltage transistors of the opposite operation circuit, bias means being provided in a one-to-one correspondence with the operation circuits and being connected to the low-voltage transistors of the operation circuits in series for activating the corresponding transistors in a stationary on state for decreasing currents flowing into the corresponding transistors, and current control means being provided accompanying the bias means in a one-to-one correspondence for increasing currents flowing into the corresponding low-voltage transistors when the transistors make the off-to-on state transition, whereby the low-voltage transistors of both the operation circuits are controlled on/off alternately in response to a state of an input signal and a high-voltage operation object is turned on/off according to the potential at the interconnection point between the low-voltage and high-voltage transistors of one operation circuit.

As seen from this configuration, also in the invention, the first and second operation circuits are used to turn on and off their corresponding transistors oppositely as in the conventional circuit in FIG. 2 originally consuming less power. In addition, the level shift circuit of the invention has the bias means provided in a one-to-one correspondence with the operation circuits and connected to the low-voltage transistors of the operation circuits in series for activating the corresponding transistors in the stationary on state for decreasing the current flowing into the corresponding transistors, thereby reducing power consumption, and the current control means provided accompanying the bias means in a one-to-one correspondence for temporarily increasing the current flowing into the corresponding low-voltage transistors in the transient state just after the transistors are turned on, thereby operating the operation object at high speed.

On the principle, the bias means and the current control means may be provided only for either of the first and second operation circuits for operating the operation object according to the potential at the interconnection point between the high-voltage and low-voltage transistors. Of course, preferably they are provided for both the first and second operation circuits; it may be rational to set the current control means of the operation circuit for directly operating the operation object so as to increase the current allowed to flow into the corresponding low-voltage transistor larger than that in the opposite operation circuit.

It is most advantageous to use a source resistor if the low-voltage transistor of the operation circuit is a MOS transistor or an emitter resistor if the low-voltage transistor is a bipolar transistor. It is advantageous to use as the current control means, a capacitor connected to the bias means in parallel or a short-circuit transistor connected to the bias means or a part thereof in parallel for turning on the low-voltage transistor only within a short time when the low-voltage transistor is turned on.

To use a capacitor for the current control means, a series resistor may be connected to the capacitor and the extent to which the current flowing into the low-voltage transistor is increased may be set according to the resistance value of the series resistor. Further, it is advantageous to connect a short-circuit transistor to the capacitor in parallel and turn on the short-circuit transistor when the low-voltage transistor is off, thereby improving the operation speed for the operation object.

To use a short-circuit for the current control means, it is rational to use a one-shot circuit as means for precisely turning on the short-circuit transistor only within a predetermined short time and give an input signal or a complementary signal to the input signal to the one-short circuit for setting the on time in response to the logical state transition of the signal.

To embody the invention, it may be advantageous to connect a high resistor to the high-voltage transistor of the operation circuit in parallel as required. Further, to use a MOS transistor for the high-voltage transistor, preferably a Zener diode is connected between the gate of the MOS transistor and the source for receiving a high-voltage side power supply voltage in parallel. It is advantageous to use the Zener diode in a state in which Zener breakdown is caused to occur when the high-voltage transistor is on. In this case, the Zener diode can be made to also serve as the above-mentioned high resistor.

Also, in the invention, an output buffer circuit for rapidly charging and discharging a capacity parasitic on a control terminal of an output stage transistor is provided. That is, according to the invention, there is provided a level shift circuit comprising a signal voltage level conversion circuit having a first first conductive transistor opened and closed under the control of logic input of narrow logic amplitude produced by a low-voltage power supply, a second first conductive transistor opened and closed exclusively with the first first conductive transistor under the control of inverted input of an opposite phase to that of the logic input, a first second conductive transistor being connected to the first first conductive transistor in series between high-voltage power supplies and closed as the second first conductive transistor is closed, and a second second conductive transistor being connected to the second first conductive transistor in series between the high-voltage power supplies and closed as the first first conductive transistor is closed, the first and second second conductive transistors making up a flip-flop via first and second storage nodes, a capacity discharge circuit having a discharge transistor opened and closed based on a voltage of either of the storage nodes for discharging a capacity parasitic on a control terminal of a second conductive transistor at an output stage, and a capacity charge circuit having a charge transistor opened and closed based on the logic input or the inverted input for charging the capacity.

Preferably, diode dampers are connected between the first and second storage nodes and the high-voltage power supply.

Further, current variable circuits are provided for causing a rapidly increased current to flow into the first and second first conductive transistors and the charge transistor in a level transition period of the logic input and then lowering to a low current.

The current variable circuits may be time limit change type current variable circuits for changing the rapidly increased current to a low current in a predetermined uniform time after the level transition of the logic input.

Still further, the current variable circuits are level detection change type current variable circuits for detecting level transition end of an output voltage appearing on the control terminal of the second conductive transistor at the output stage and changing the rapidly increased current to a low current.

The level shift circuit comprising the level detection change type current variable circuits can further include a first conductive transistor at the output stage forming a complementary drive system of an output terminal together with the second conductive transistor at the output stage and a closing timing circuit using output level detection signals of the level detection change type current variable circuits to inhibit the first and second conductive transistors at the output stage from being closed simultaneously.

The discharge transistor opened and closed based on the voltage of either of the storage nodes is provided apart from the first and second second conductive transistors making up the flip-flop and neither of the storage nodes are connected to the control terminal of the second conductive transistor at the output stage. Thus, the discharge transistor is not affected by the parasitic capacity on the control terminal and is opened fast. Thus, the current produced by the charge transistor is hard to flow as a through current and the parasitic capacity on the control terminal can be charged rapidly. Therefore, the switching speed of the second conductive transistor at the output stage can be made high. Since the through current lessens, power consumption can be decreased.

In the level shift circuit comprising diode clampers connected between the first and second storage nodes and the high-voltage power supply, the element withstand voltage of the transistors making up the flip-flop, etc., can be made low.

Further, in the level shift circuit comprising the current variable circuits, the rapidly increased current causes the state transition of the flip-flop to be speeded up, contributing to an improvement in the switching speed. At the same time, the opening operation of the discharge transistor is accelerated, so that the period of the through current via the discharge transistor is shortened and power consumption is furthermore decreased.

Particularly, according to the level shift circuit using the level detection change type current variable circuits as the current variable circuits, the rapidly increased current period is not too long or short and the rapidly increased current can be allowed to flow only for the optimum time, thus speeding up the state transition operation and low power consumption can be accomplished at the same time.

When the semiconductor integrated circuit having the first conductive transistor at the output stage forming the complementary drive system of the output terminal together with the second conductive transistor at the output stage is provided with the closing timing circuit using output level detection signals of the level detection change type current variable circuits to inhibit the first and second conductive transistors at the output stage from being closed simultaneously, if a closing control signal of the first conductive transistor at the output stage is generated before the second conductive transistor at the output stage is opened, the first conductive transistor at the output stage is not closed until the second conductive transistor at the output stage is actually opened by the closing timing circuit. Thus, the through current at the output stage can be eliminated and power consumption can be made low drastically.

The above and other objects and features of the present invention will be more apparent from the following description taken in conjunction with the accompanying drawings.

BRIEF DESCRIPTION OF THE DRAWINGS

In the accompanying drawings:

FIGS. 7A to 7E show a level shift circuit according to a first embodiment of the invention and related waveforms, in which FIG. 7A is a circuit diagram of the level shift circuit, FIG. 7B is a waveform chart of an input signal, FIG. 7C is a waveform chart of a current flowing into a low-voltage transistor of a first operation circuit, FIG. 7D is a waveform chart of a current flowing into a low-voltage transistor of a second operation circuit, and FIG. 7E is a waveform chart of a current flowing into an operation object;

FIGS. 10A to 10G show a level shift circuit according to a fourth embodiment of the invention and related waveforms, in which FIG. 10A is a circuit diagram of the level shift circuit, FIG. 10B is a waveform chart of an input signal to the level shift circuit, FIG. 10C is a waveform chart of an on operation, command by a one-shot circuit of a first operation circuit, FIG. 10D is a waveform chart of an on operation command by a one-shot circuit of a second operation circuit, FIG. 10E is a waveform chart of a current flowing into a low-voltage transistor of the first operation circuit, FIG. 10F is a waveform chart of a current flowing into a low-voltage transistor of the second operation circuit, and FIG. 10G is a waveform chart of a current flowing into an operation object;

DETAILED DESCRIPTION OF THE PREFERRED EMBODIMENTS

Now, a description will be given in more detail of embodiments of the invention with reference to the accompanying drawings.

Figure 8:
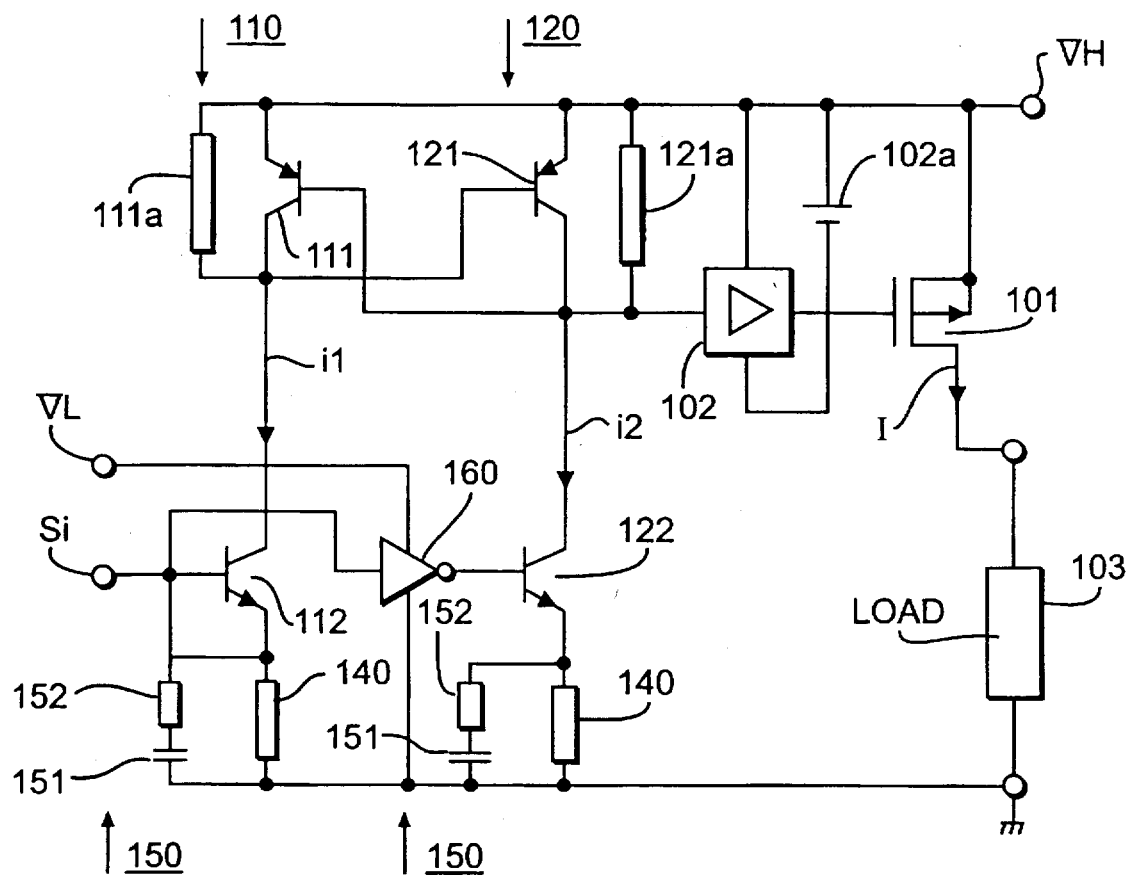
FIG. 8 is a circuit diagram of a level shift circuit according to a second embodiment of the invention.
Figure 9:
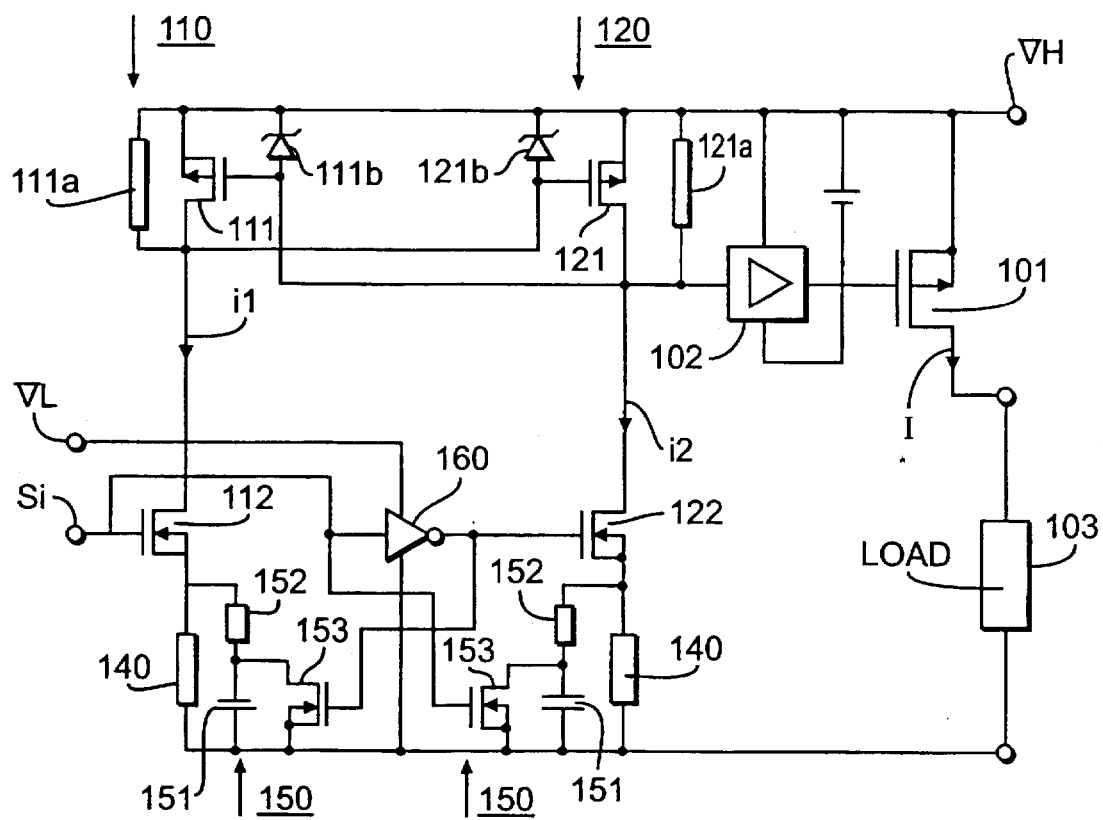
FIG. 9 is a circuit diagram of a level shift circuit according to a third embodiment of the invention.

FIGS. 7A to 7E show a first embodiment of a level shift circuit according to the invention together with related waveform charts. FIGS. 8 and 9 show second and third embodiments. FIGS. 10A to 10G show a fourth embodiment together with related waveform charts. Although an operation object 1 is a MOS transistor in the embodiments, the invention can also be applied to semiconductor devices or circuit devices of bipolar transistors, etc., as the operation object 1, needless to say.

First Embodiment

Figure 1:
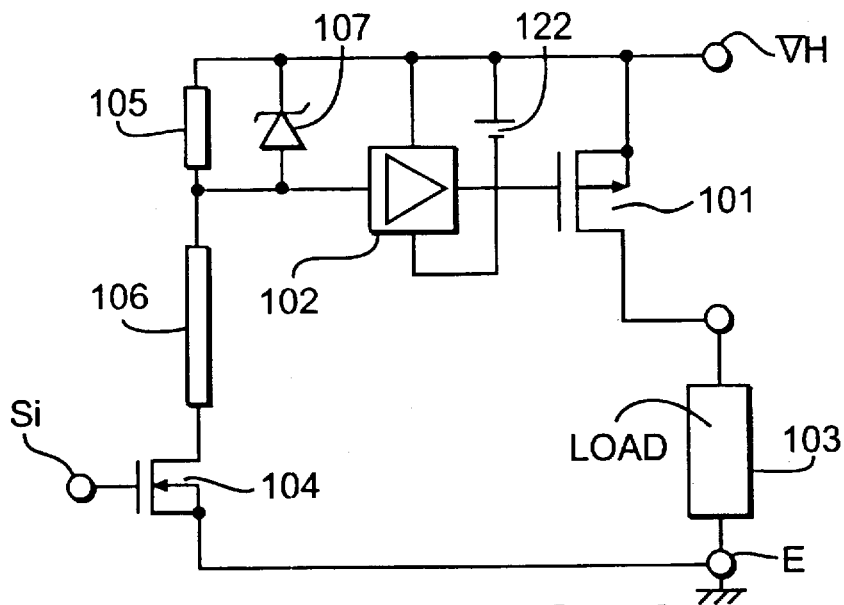
FIG. 1 is a circuit diagram of a level shift circuit in a prior art.
Figure 2:
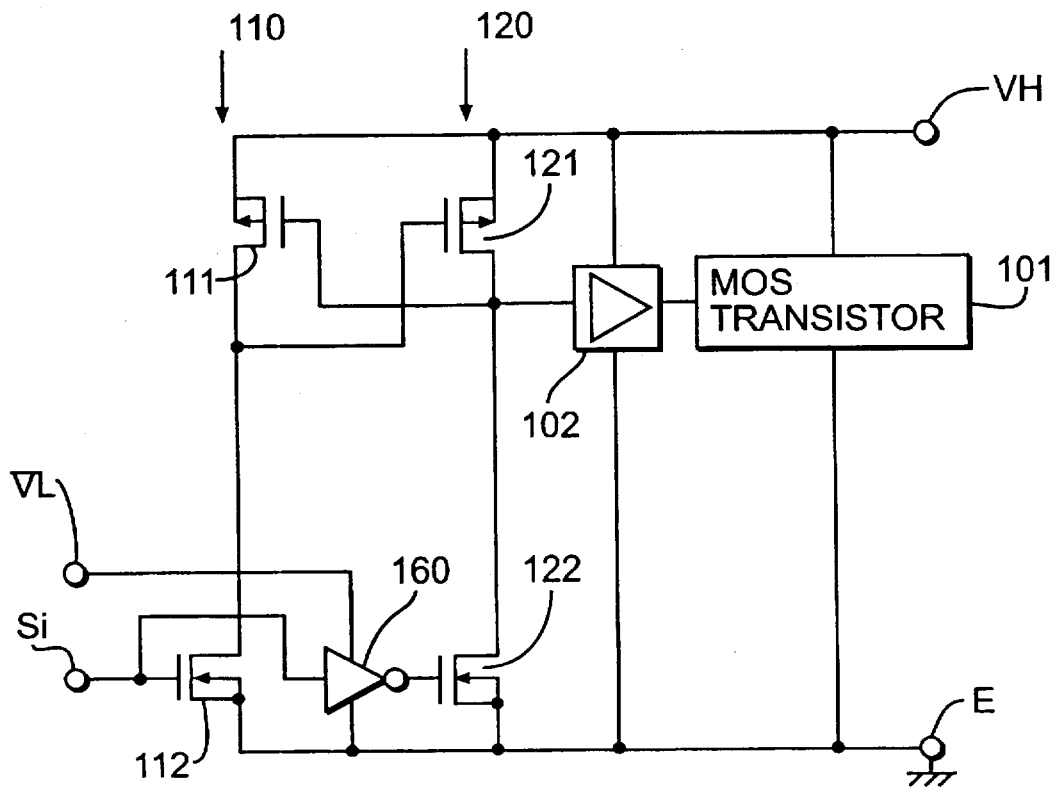
FIG. 2 is a circuit diagram of an example of another conventional level shift circuit.
Figure 3:
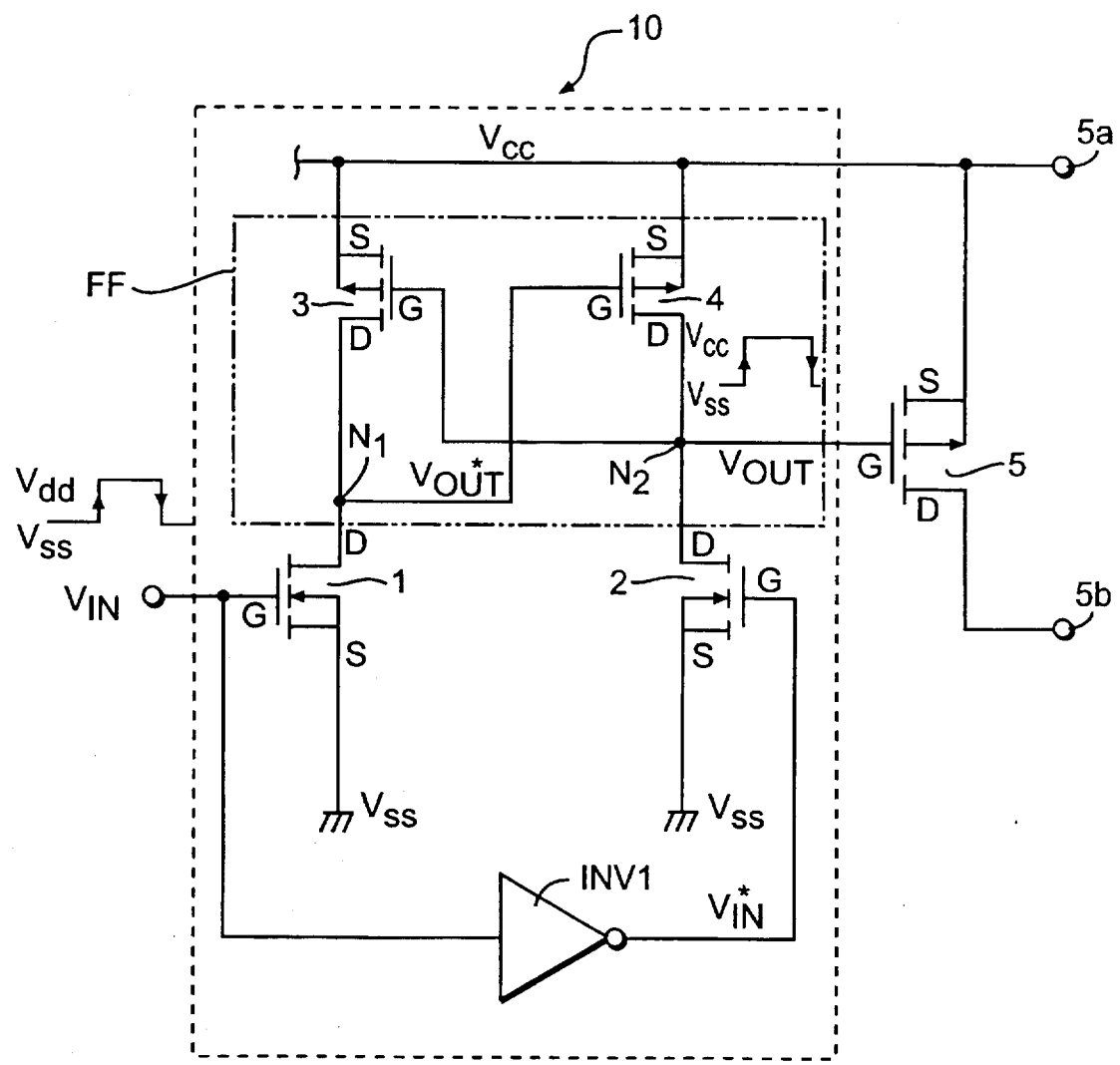
FIG. 3 is a circuit diagram to show a conventional basic-type level shift circuit and its output stage transistor.
Figure 4:
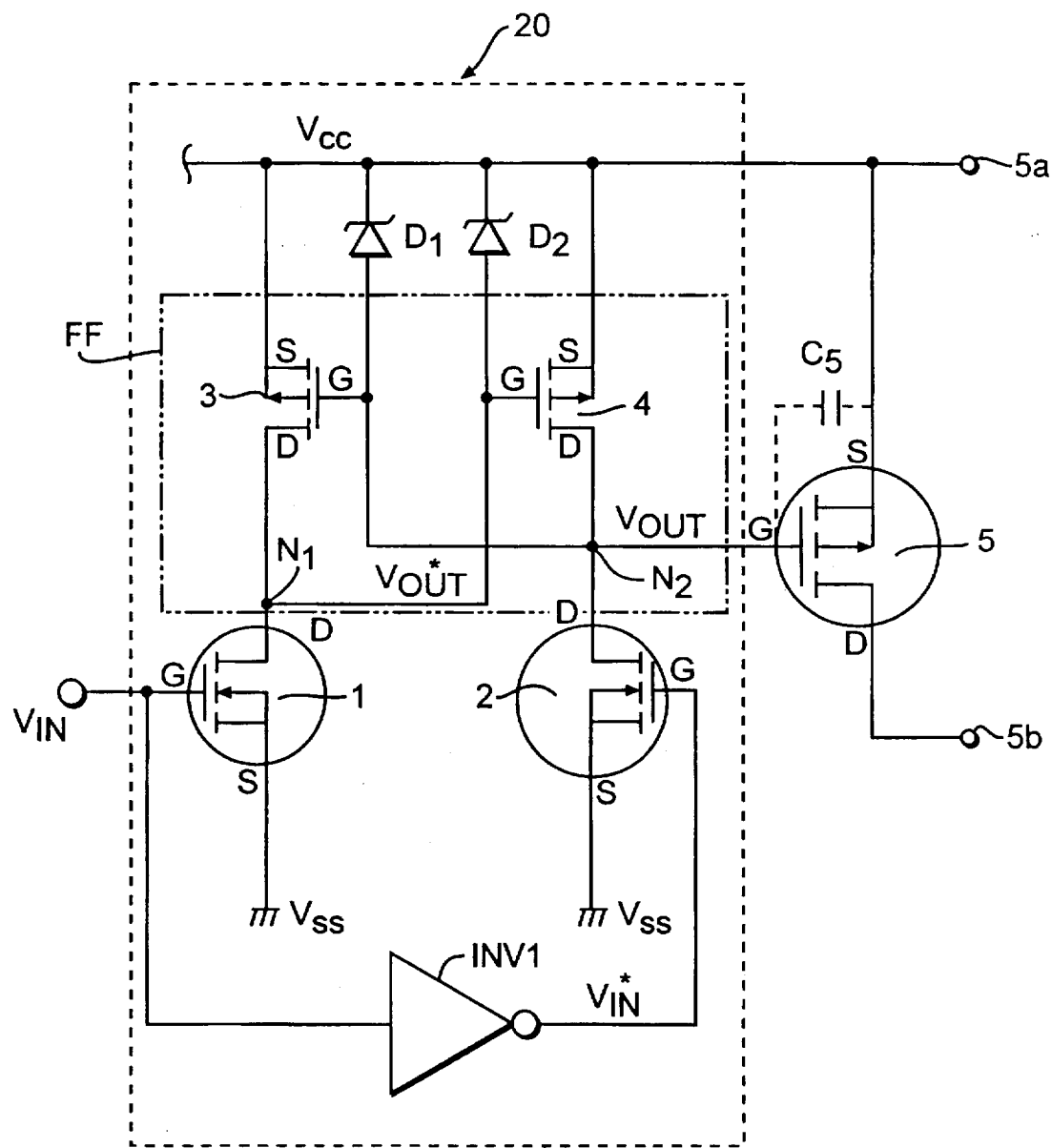
FIG. 4 is a circuit diagram to show a conventional level shift circuit comprising a diode clamper and its output stage transistor.

In the example shown in FIG. 7A, an operation object 101 of a power MOS transistor is used to drive a load 103 as in the conventional example in FIG. 1 and is operated through a drive circuit 102 by a level shift circuit shown on the left of the figure. To supply power to the drive circuit 102 normally made up of a plurality of inverter stages, for example, a 15-V floating power supply (not shown) is connected to several hundred V high-voltage side power supply voltage VH. The level shift circuit of the invention comprises a first operation circuit 110, a second operation circuit 120, bias means 140, and current control means 150. An inverter 160 operating upon reception of low-voltage side power supply voltage VL of about 5 V is used in relation to the level shift circuit.

The first and second operation circuits 110 and 120 comprise the high-voltage transistors 111 and 121 (MOS transistors) and the low-voltage transistors 112 and 122 (MOS transistors) connected in series in the example in FIGS. 10A to 10G. In the embodiment, each of the operation circuits 110 and 120 is provided with the bias means 140 in the form of source resistance for the n-channel low-voltage transistors 112 and 122, and the low-voltage transistors 112 and 122 are operated as so-called source followers in the stationary state. A low-voltage input signal Si is given to a gate of the low-voltage transistor 112 of the first operation circuit 110 and a complementary signal to the input signal Si by the inverter 160 is given to a gate of the low-voltage transistor 122 of the second operation circuit 120.

In the embodiment, high resistors 111a and 121a are connected to p-channel high-voltage transistors 111 and 121 of the first and second operation circuits 110 and 120 in parallel, and Zener diodes 111b and 121b are connected between the gates and the sources receiving the high-voltage side power supply voltage VH. The Zener diodes 111b and 121b may be provided only for protecting the gates of the high-voltage transistors 111 and 121, but it is more rational to cause Zener breakdown when the transistor 111, 112 is turned on, in which case the high resistors 111a and 121a can be omitted appropriately.

In the invention, the first and second operation circuits 110 and 120 are interconnected so that the high-voltage transistor 121 of the second operation circuit 120 is controlled according to the potential at the interconnection point between the transistors 111 and 112 of the first operation circuit 110 and that the high-voltage transistor 111 of the first operation circuit 110 is controlled according to the potential at the interconnection point between the transistors 121 and 122 of the second operation circuit 120, as shown in FIGS. 7A to 7E. Operation voltage for the operation object 101 may be taken out from either of the operation circuits 110 and 120; in the example shown in the figure, the potential at the interconnection point between the transistors 121 and 122 of the second operation circuit 120 is given to the drive circuit 102 of the operation object 101.

When the input signal Si is high, the low-voltage transistor 112 of the operation circuit 110 receives it and is turned on. Thus, the gate potential of the high-voltage transistor 121 of the operation circuit 120 lowers and the high-voltage transistor 121 is turned on. At this time, the low-voltage transistor 122 of the operation circuit 120 receives low from the inverter 160 and is turned off. Thus, the high-voltage transistor 111 of the operation circuit 110 receives the high-voltage side power supply voltage VH at the gate and is turned off. When the input signal Si is low, the on/off state of every transistor of the operation circuits 110 and 120 becomes opposite to it. Thus, in the invention, a stationary through current flows into neither the operation circuit 110 nor 120 as in the conventional example.

In the invention, the current control means 150 are provided accompanying the bias means 140 for increasing a current flowing into the low-voltage transistors 112 and 122 just after the transistors are turned on. In the embodiment, a capacitor 151 is used as the current control means 150 and the capacitor 151 and a series resistor 152 are connected to a source resistor of the low-voltage transistor 112(122) as the bias means 140 in parallel. Since a charge current starts to flow into the capacitor 151 just after the transistor 112(122) is turned on, the current flowing into the transistor 112(122) increases transiently and decreases as the charge terminates. When the transistor 112(122) is turned off, the capacitor 151 is discharged via the series resistor 152 and the source resistor as the bias means 140.

FIGS. 7C and 7D show the waveforms of currents i1 and i2 flowing into the low-voltage transistor 112 of the operation circuit 110 and the low-voltage transistor 122 of the operation circuit 120, respectively, when the logic state transition of the input signal Si is made as shown in FIG. 7B. As shown here, an acute peak current ip, charge current of the capacitor 151, appears on the waveform of the current i1(i2) just after the transistor 112(122) is turned on, and the currents i1 and i2 are set to a extremely low stationary current is in a short time. The bias means 140 or the source resistance plays a role in decreasing the stationary current is and negative feedback as the source follower is applied to the low-voltage transistor 112(122) in the stationary state after the capacitor 151 is charged, whereby the transistor 112(122) is activated and the current i1(i2) is narrowed to extremely low stationary current is of about 10–20 μA, for example, set by the gate threshold value and the resistance value of the source resistor. The bias means 140 is set so that the voltage drop caused by the current i1(i2) becomes larger than the gate threshold value of the low-voltage transistor 112(122) so as to enhance the narrowing effect.

Preferably, the ratio between the peak current ip and the stationary current is is set to 10 times or more, whereby the high-voltage transistors 111 and 121 can be turned on at high speed by rapidly charging their gates. To set the peak current ip large, the electrostatic capacity of the capacitor 151 of the current control means 150 may be set to a value larger than the sum of the gate capacity of the high-voltage transistor 111(121) and the junction capacitance of the Zener diode 111b(121b), namely, several to ten times as large as the sum, such as about 1 pF or more. To speed up the off operation of the transistor 111(121), its on resistance may be set low for increasing the discharge speed of the associated gate. To accelerate the operation speed for the drive circuit 102 in the embodiment, preferably the peak current ip of the current i2 of the second operation circuit 120 is set large by selecting a resistance value of the series resistor 152, for example, and the on resistance of the high-voltage transistor 121 is set extremely small, thereby increasing the charge and discharge speed for the electrostatic capacity on the input side of the drive circuit 102.

As understood from the description made so far, according to the invention, each time the logic state transition of the input signal Si is made as shown in FIG. 7B, the current control means 150 cause the large peak current ip to flow into the low-voltage transistors 112 and 122 of the operation circuits 110 and 120 as-shown in FIGS. 7C and 7D, whereby current I is allowed to flow into the operation object 101 rapidly intermittently as shown in FIG. 7E and the stationary current is flowing into the transistors 112 and 122 is narrowed by the bias means 140, whereby power consumption of the operation circuits 110 and 120 can be minimized as required.

Second Embodiment

A level shift circuit in a second embodiment of the invention shown in the circuit diagram in FIG. 8 has almost the same configuration as the level shift circuit shown in FIG. 7A except that pnp-type bipolar transistors are used as high-voltage transistors 111 and 112 of first and second operation circuits 110 and 120 and except that pnp-type bipolar transistors are used as low-voltage transistors 112 and 122. Emitter resistors are connected to the low-voltage transistors 112 and 122 as bias means 140 and each current control means 150 connected to the bias means in parallel has the same configuration as shown in FIG. 7A. The Zener diodes 111b and 121b connected to the gates of the high-voltage transistors 111 and 112 in the first embodiment are omitted in the circuit in FIG. 8. The operation of the second embodiment is substantially the same as that of the first embodiment and therefore will not be discussed again.

Third Embodiment

The circuit of a third embodiment of the invention shown in FIG. 9 is also almost the same as the circuit in FIG. 7A except that short-circuit transistors 153 are connected to capacitors 151 of current control means 150 in parallel. The capacitors 151 are charged when low-voltage transistors 112 and 122 are turned on. Then, they are discharged when the low-voltage transistors 112 and 122 are off. If the resistance values of series resistors 152 in discharge paths and source resistors as bias means 140 are large or the operation cycle of an operation object 101 is short, charging the capacitors 151 is started before completion of discharging. Thus, in the circuit in FIG. 9, a complementary signal to an input signal Si by an inverter 160 is given to the short-circuit transistor 153 of a first operation circuit 110 and the input signal Si is given to the short-circuit transistor 153 of a second operation circuit 120 for turning on the low-voltage transistors 112 and 122 in the off state, thereby short circuiting the capacitors 151 and completely discharging them. Even if the resistance values of the source resistors for the bias means 140 are large, the capacitors 151 are completely discharged. Thus, in the third embodiment, peak currents ip of currents i1 and i2 can be set large or the frequency at which the operation object 101 can be operated can be raised to about 1 MHz or more.

Fourth Embodiment

Figure 10A:
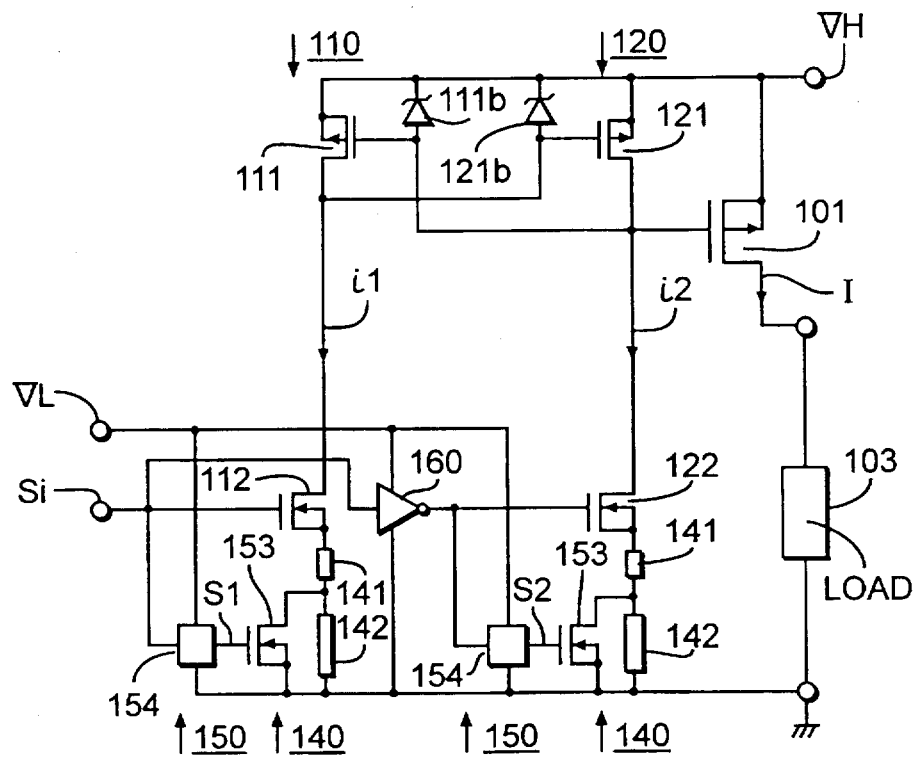
Figure 10B:
Figure 10C:
Figure 10D:
Figure 10E:
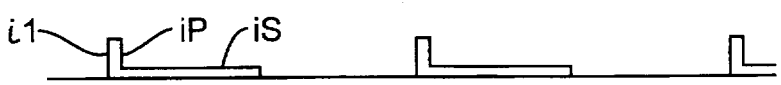
Figure 10F:
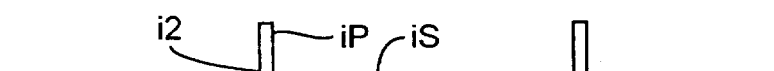

In a fourth embodiment of the invention shown in FIGS. 10A to 10G, as shown in the circuit diagram in FIG. 10A, each short-circuit transistor 153 as current control means 150 is connected to at least a part of a source resistor for bias means 140 (in the example, a resistor part 142 of resistor parts 141 and 142 into which the source resistor is divided) in parallel and each time a low-voltage transistor 112(122) of an operation circuit 110(120) is turned on, the corresponding short-circuit transistor 153 is turned on only for a short time just after the low-voltage transistor is turned on, whereby peak current ip set to a predetermined value as current i1(i2) shown in FIG. 10E (FIG. 10F) is allowed to flow into the low-voltage transistor 112(122).

In the circuit example in FIG. 10A, one-shot circuits 154 as means for precisely turning on the short-circuit transistors 153 only for a predetermined time are used to supply low-voltage side power supply voltage VL and an input signal Si and a complementary signal to the input signal Si are given to the one-shot circuits 154 of the first and second operation circuits 110 and 120 respectively. Each time the logic state transition of the input signal Si is made as shown in FIG. 10B, a high on operation command S1 shown in FIG. 10C or S2 in FIG. 10D is given to the corresponding short-circuit transistor 153 for a short time, such as 50–100 ns, whereby the one-shot circuit 154 causes the peak current ip to occur within the setup time in the current i1(i2) shown in FIG. 10E (FIG. 10F) flowing into the low-voltage transistor 112(122) of the operation circuit 110(120). Of course, after the expiration of the setup time, the currents i1 and i2 lower to low stationary current is set by the bias mean 140.

In the circuit in FIG. 10A, the drive circuit 102 of the operation object 101 and the floating power supply 102a for the drive circuit 102 used in the first to third embodiments are omitted and an operation object 101 is operated directly according to the potential at the interconnection point between transistors 121 and 122 of the operation circuit 120. Therefore, in the embodiment in FIGS. 10A to 10G, the operation power of the operation circuit 120 needs to be made higher than that of the operation circuit 110. Thus, the peak current ip of the current i2 of the operation circuit 120 is set larger than that of the current i1 of the operation circuit 110. Setting of the value of the peak current ip can be easily adjusted by the resistance value distribution ratio to the resistor parts 141 and 142 for the bias means 140, for example. When the stationary current is 20 μA, the peak current ip of the operation circuit 120 is set to 20 mA three orders of magnitude greater than the stationary current, for example.

Figure 10G:

The on operation of the operation object 101 is speeded up by enhancing the peak current ip of the operation circuit 120. To speed up the off operation, a transistor with a low on resistance value may be used as the high-voltage transistor 121 to discharge the gate capacity of the MOS transistor of the operation object 101 in a short time. FIG. 10G shows the waveform of current I flowing into the operation object 101 operated directly by the operation circuit 120 thus configured. As shown here, the current I has a steep intermittent waveform like the current I in the first embodiment in FIGS. 7A to 7E. The time required for the on/off operation of the operation object 101 is about 50 s. It is desirable to slightly enhance the drive force for the high-voltage transistor 121 of the operation circuit 120 also in the operation circuit 110 in response to enhancement of the drive force of the operation circuit 120. For this purpose, transistors with a low on resistance value may be used as the transistors 111 and 112 of the operation circuit 110 to accelerate charging and discharging the gate capacity of the transistor 121.

In the circuit shown in FIG. 10A, the high resistors 111a and 121a connected to the high-voltage transistors 111 and 121 of the operation circuits 110 and 120 in parallel used in the first to third embodiments are omitted and the Zener diodes 111b and 121b on the gate sides are made to also serve as the high resistors. For example, when the low-voltage transistor 112 of the operation circuit 110 is on, the high-voltage transistor 121 of the operation circuit 120 is on. Thus, the current i1 flows into the transistor 112 via the Zener diode 121b for the transistor 121 from high-voltage side power supply voltage VH. Of course, the Zener diode 111b and 121b have Zener voltage selected so as to break down when the transistors 111 and 121 corresponding to the Zener diodes 111b and 121b are on.

The invention can be embodied in various forms in addition to the embodiments we have discussed. For example, in the embodiments shown in the figures, the operation potential is given from the second operation circuit 120 to the operation object 101; however, since the both operation circuits 110 and 120 are symmetrical, the operation potential may be given from the first operation circuit 110 to the operation object 101. In the embodiments, the current control means 150 is provided for each of the operation circuits 110 and 120. As understood from the fourth embodiment in FIGS. 10A to 10G, the currents i1 and i2 and the peak current ip should be set separately as required. The current control means 150 may be provided only for either of the operation circuits 110 and 120, particularly for the operation circuit for giving the operation potential to the operation object 101. In this case, further the bias means 140 corresponding to the omitted current control means 150 may also be able to be omitted.

Fifth Embodiment

Figure 11:
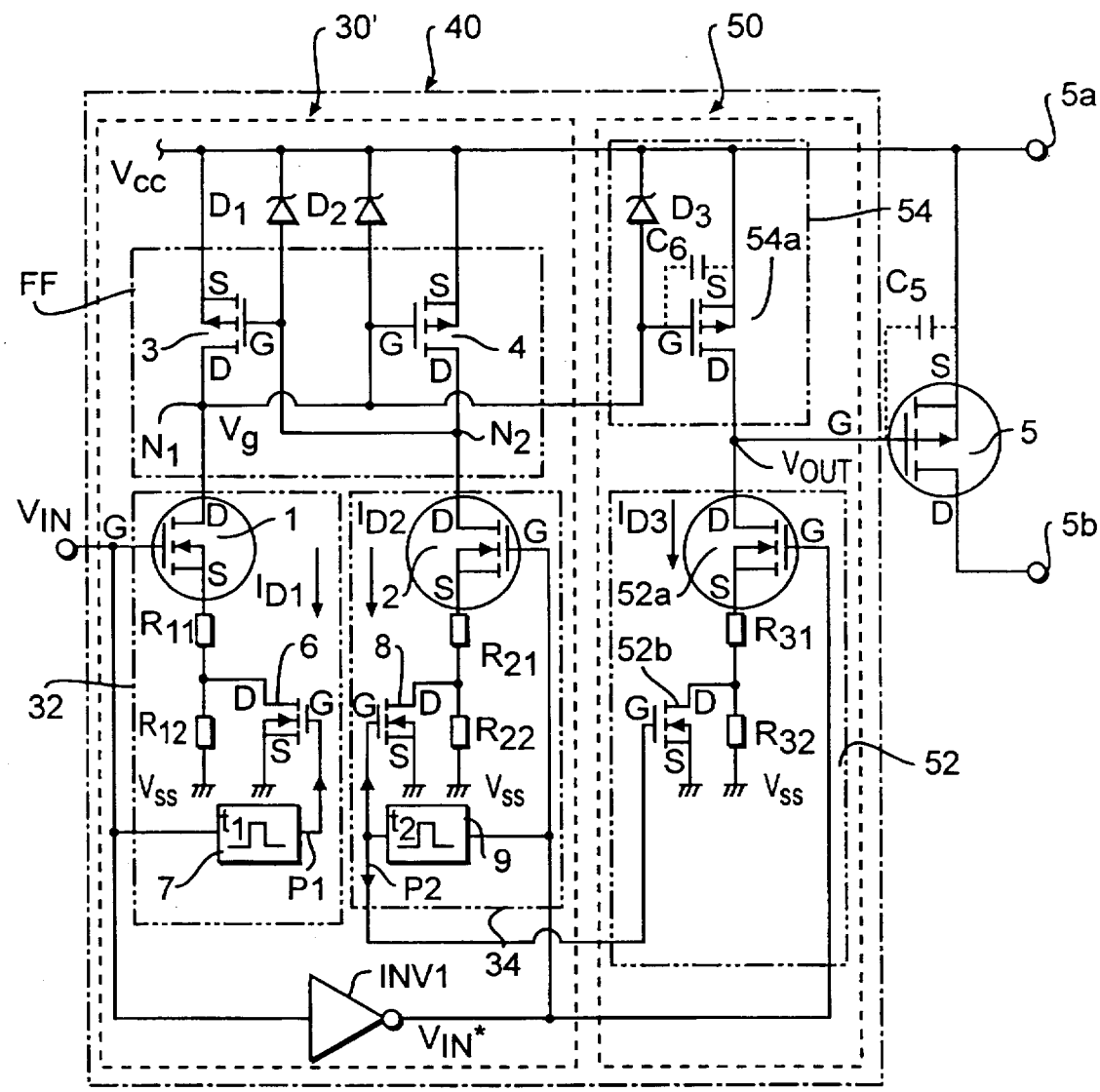
FIG. 11 is a circuit diagram to show a level shift circuit according to a fifth embodiment of the invention and its output stage transistor.

FIG. 11 is a circuit diagram to show a level shift circuit according to a fifth embodiment of the invention and its output stage transistor.

Figure 5:
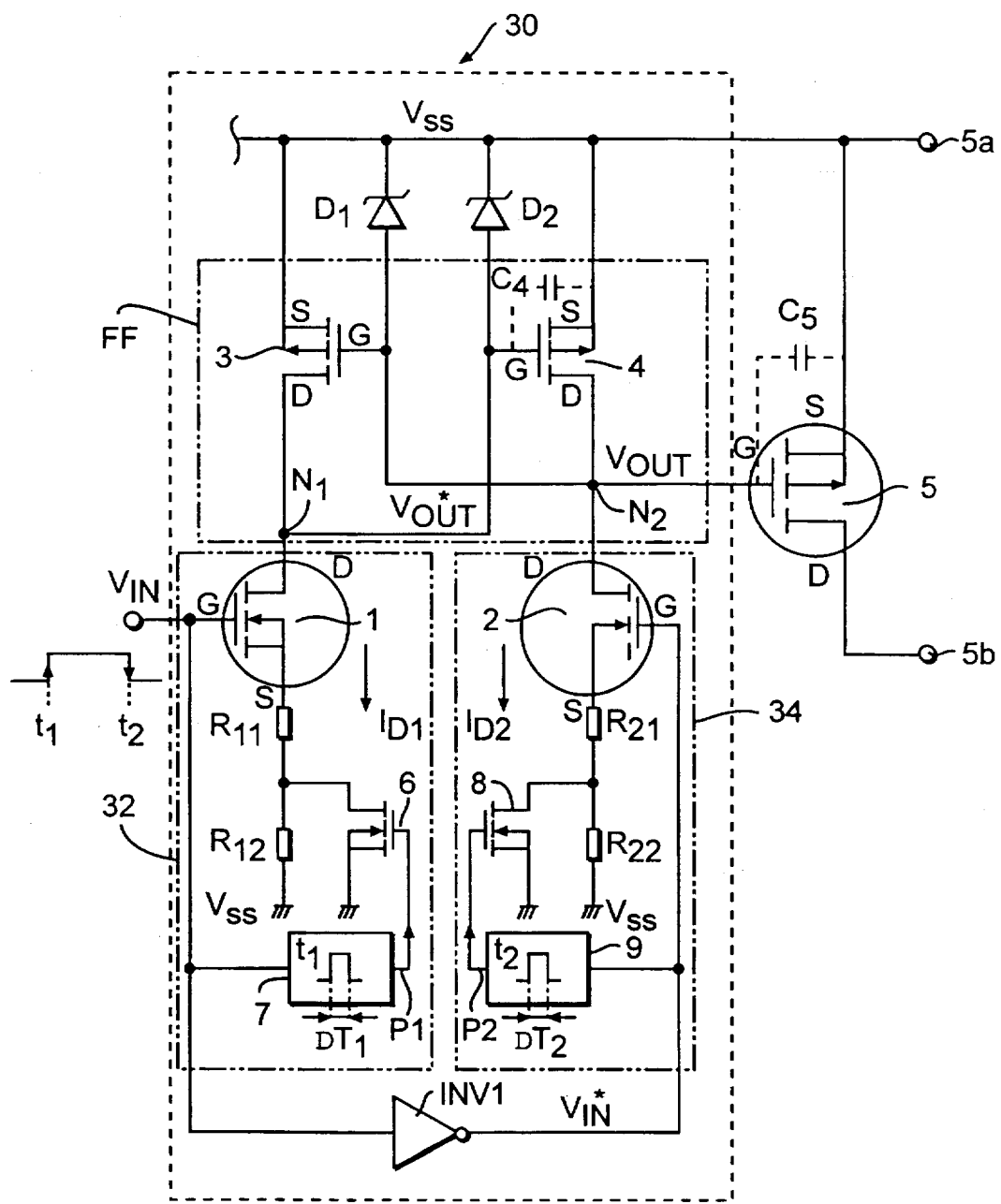
FIG. 5 is a circuit diagram to show an improvement on the level shift circuit shown in FIG. 8 and an output stage transistor of the improved circuit.
Figure 6:
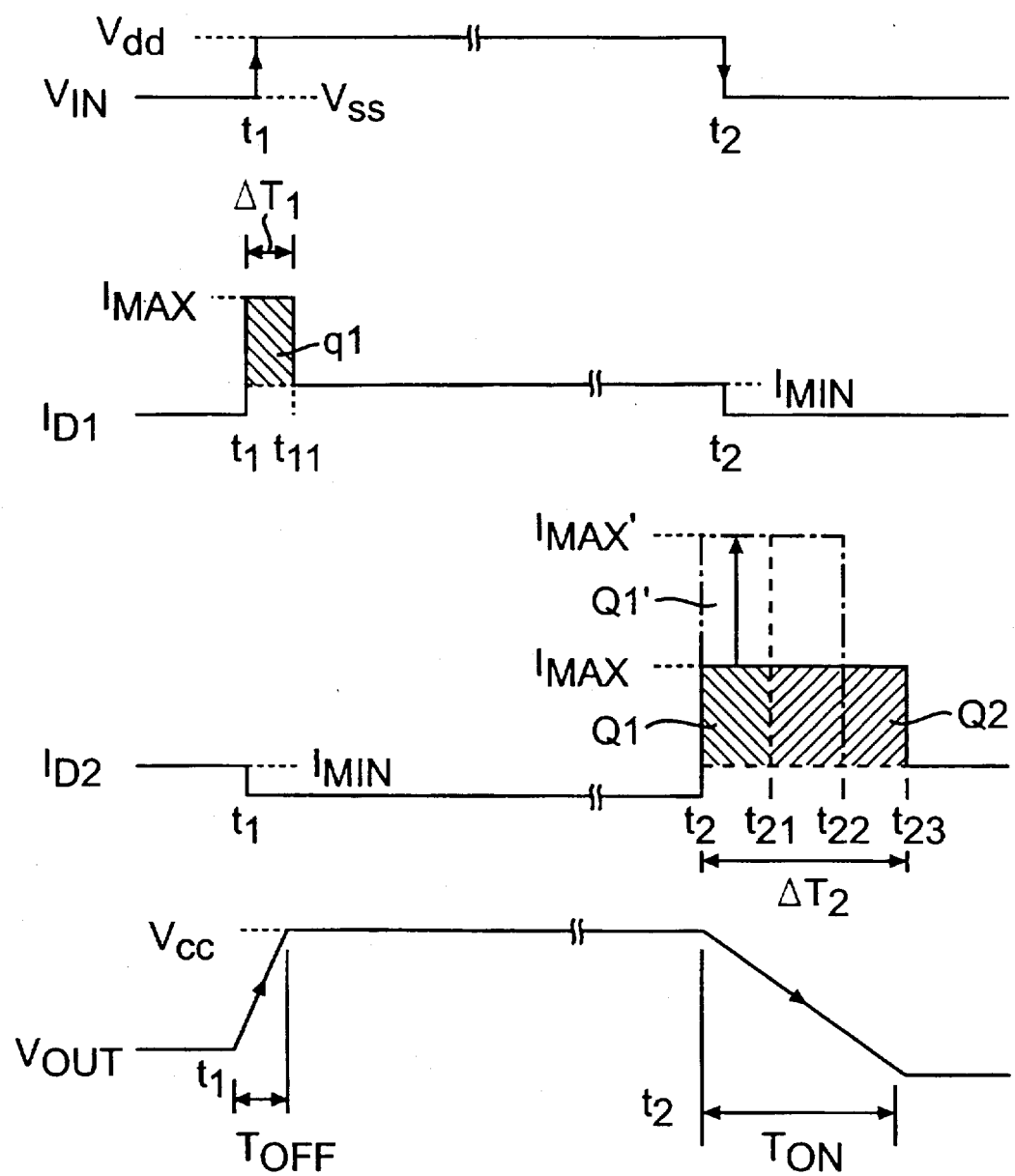
FIG. 6 is a timing chart to show waveforms of the parts of the circuit shown in FIG. 5.

The level shift circuit of the embodiment has a signal voltage level conversion circuit 30' with the drain node N2 of the level shift circuit 30 (shown in FIG. 5) unconnected to a gate G of a power p-channel MOSFET 5 at the output stage and an output buffer circuit 50 for rapidly charging and discharging a gate capacity C5 of the power p-channel MOSFET 5 at the output stage based on a node voltage Vg and an inverted input signal VIN* of a flip-flop FF of the signal voltage level conversion circuit 30'.

The signal voltage level conversion circuit 30' has a CMOS inverter INv1 for generating an inverted signal VIN* of opposite phase in a 3-V range from a logic input signal VIN of narrow logic amplitude (3 V=Vdd−Vss) produced by a 3-V power supply, a first high-voltage resistance n-channel MOSFET 1 opened and closed under the control of the logic input signal VIN, a second high-voltage resistance n-channel MOSFET 2 opened and closed under the control of the inverted signal VIN* exclusively with the first n-channel MOSFET 1, a first p-channel MOSFET 3 forming a 2-stage series circuit together with the first n-channel MOSFET 1 between 30-V (Vcc) power supplies and closed as the second n-channel MOSFET 2 is closed, and a second p-channel MOSFET 5 forming a 2-stage series circuit together with the second n-channel MOSFET 2 between 30-V (Vcc) power supplies and closed as the first n-channel MOSFET 1 is closed. The first p-channel MOSFET 3 and the second p-channel MOSFET 5 make up a flip-flop FF of a feedback loop via drain nodes (storage nodes) N1 and N2.

The gates of the first and second p-channel MOSFETs 3 and 5 (drain nodes N1 and N2) are connected to the Vcc power supply via voltage regulation diodes D1 and D2 for diode clamper.

The signal voltage level conversion circuit 30' of the embodiment also comprises drain current variable circuits 32 and 34. The first drain current variable circuit 32 has source resistors R11 and R12 in series making up a source follower circuit (constant current circuit) together with the first n-channel MOSFET 1 operating in a non-saturation region, an n-channel MOSFET 6 for changing source resistance value for short-circuiting the source resistor R12, and a one-shot circuit (monostable multivibrator) 7 for applying a change time limit pulse P1 of predetermined pulse width 172 ΔT1 to a gate of the MOSFET 6 at time t1 at which logic input signal VIN rises. The second drain current variable circuit 34 also has source resistors R21 and R22 in series making up a source follower circuit (constant current circuit) together with the second n-channel MOSFET 2 operating in a non-saturation region, an n-channel MOSFET 8 for changing source resistance value for short-circuiting the source resistor R22, and a one-shot circuit 9 for applying a change time limit pulse P2 of predetermined pulse width ΔT2 to a gate of the MOSFET 8 at time t2 at which the logic input signal VIN falls.

The output buffer circuit 50 has a gate capacity charge circuit 52 for rapidly charging the gate capacity C5 of the power p-channel MOSFET 5 at the output stage at one state transition of the flip-flop FF and a gate capacity discharge circuit 54 for rapidly discharging the gate capacity C5 of the power p-channel MOSFET 5 at the output stage at the other state transition of the flip-flop FF.

The gate capacity charge circuit 52 is a charge pump for lowering the voltage of the gate G from the Vcc voltage (source voltage) by drawing out charges from the gate G of the gate capacity C5 and supplying the charges to ground (Vss). It has a high-voltage resistance n-channel MOSFET 52a for charging, opened and closed in synchronization with the second high-voltage resistance n-channel MOSFET 2 under the control of the inverted signal VIN*, source resistors R31 and R32 in series making up a source follower circuit (constant current circuit) together with the high-voltage resistance n-channel MOSFET 52a for charging, operating in a non-saturation region, and an n-channel MOSFET 52b for changing source resistance value for short-circuiting the source resistor R32. The MOSFET 52b receives the time limit pulse P2 from the one-shot circuit 9 at a gate and is opened/closed.

The gate capacity discharge circuit 54 has a p-channel MOSFET 54a for discharging, of a comparatively large element connected across the gate capacity C5 (between source and drain) and opened and closed under the control of node voltage Vg of the drain node N1 and a voltage regulation diode D3 for diode clamper, connected between a gate of the MOSFET 54a and the Vcc power supply.

Figure 12:
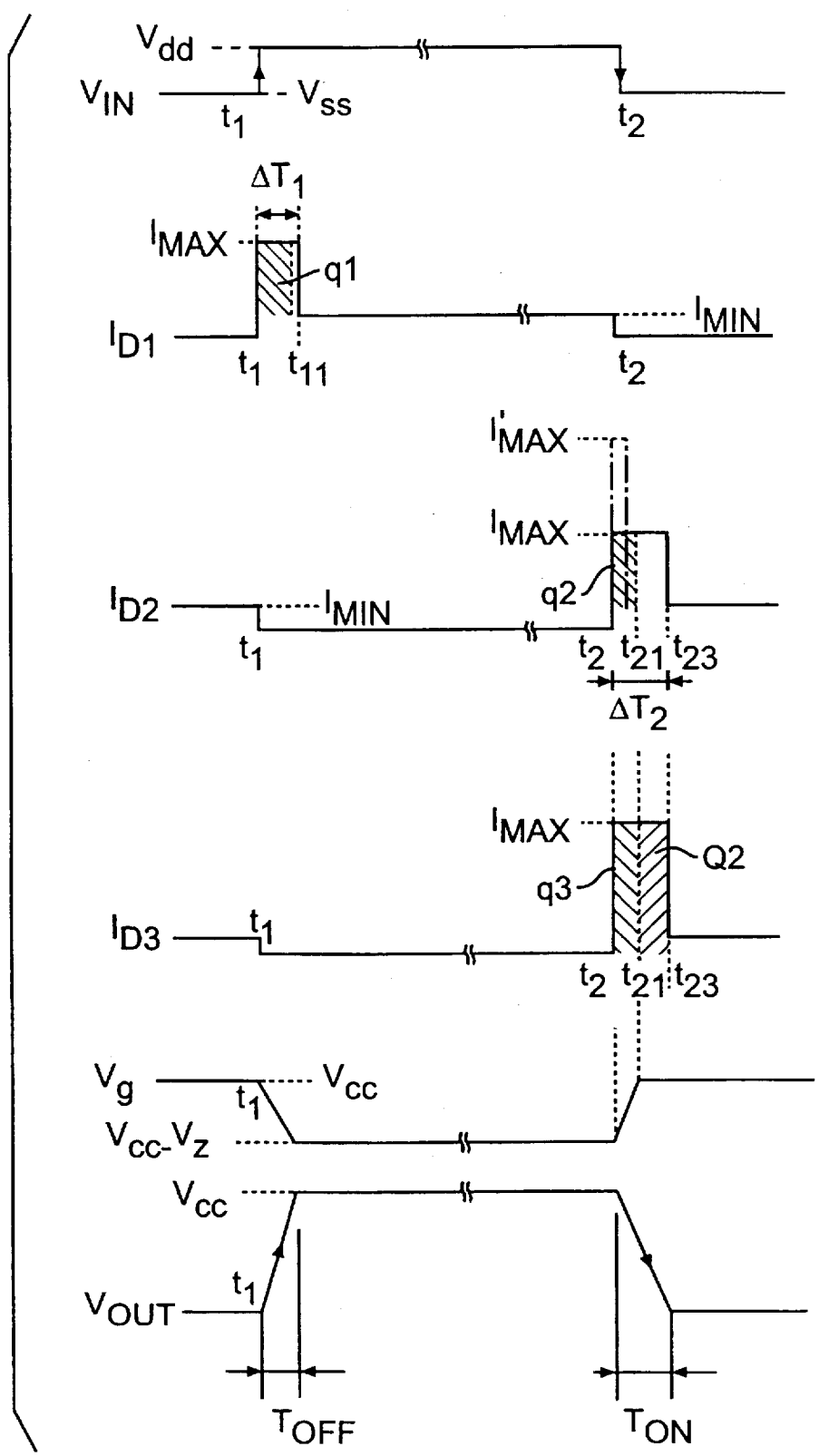
FIG. 12 is a timing chart to show waveforms of the parts of the level shift circuit in the fifth embodiment.

First, as shown in FIG. 12, when the logic input signal VIN of narrow logic amplitude (0–3 V) rises at the time t1 and the first n-channel MOSFET 1 is closed and the second n-channel MOSFET 2 is opened, the time limit pulse P1 of the drain current variable circuit 32 causes rapidly increased current IMAX to flow through the first n-channel MOSFET 1. Thus, the node voltage Vg rapidly drops by Zener voltage Vz of the voltage regulation diode D2 from Vcc. Resultantly, the second p-channel MOSFET 4 and the MOSFET 54a for discharging are closed.

By the way, in the embodiment, the second p-channel MOSFET 4, which need not rapidly discharge the gate capacity C5 of the power p-channel MOSFET 5 at the output stage, is formed as a small-scale element. On the other hand, the p-channel MOSFET 54a for discharging is formed as a large-scale element to rapidly discharge the gate capacity C5 and a gate capacity C6 parasitic on the MOSFET 54a cannot be ignored. However, the node voltage Vg can be dropped rapidly by raising the current value of the rapidly increased current IMAX with a narrowed pulse width. As the second p-channel MOSFET 4 and the p-channel MOSFET 54a for discharging are closed, whereby the voltage of the node N2 becomes high level Vcc, thereby opening the first p-channel MOSFET 3. The time at which the first p-channel MOSFET 3 is opened corresponds substantially to the time t11 at which the drain current of the first n-channel MOSFET 1 is restored to power-saving current IMIN by the drain current variable circuit 32. After this, almost all of the power-saving current IMIN is used to maintain the Zener voltage Vz of the voltage regulation diode D2.

When the node voltage Vg drops by Zener voltage Vz from Vcc, the p-channel MOSFET 54a for discharging is also closed. Thus, the gate capacity C5 of the power p-channel MOSFET 5 at the output stage is instantly discharged. Resultantly, the power p-channel MOSFET 5 at the output stage is turned off steeply.

Next, the second n-channel MOSFET 2 is closed at the time t2 at which the logic input signal VIN falls and the first n-channel MOSFET 1 is opened. At the same time, the MOSFET 52a for charging is closed. Thus, on one hand, as the second n-channel MOSFET 2 is closed, the rapidly increased drain current IMAX flows, but the gate G of the power p-channel MOSFET 5 at the output stage is not connected to the node N2 and the gate capacity C5 need not be charged. Thus, the voltage of the node N2 rapidly drops, the first p-channel MOSFET 3 immediately is closed, the gate capacity C6 is discharged, and the MOSFET 54a for discharging is opened soon. On the other hand, as the MOSFET 52a for charging is closed, charges drawn out from the gate capacity C5 of the power p-channel MOSFET 5 at the output stage flow as drain current ID3, so that the gate capacity C5 is charged promptly. As a result, output voltage VOUT lowers, thus the power p-channel MOSFET 5 at the output stage is turned off steeply.

By the way, the energization time ΔT2 for which the rapidly increased drain current IMAX is allowed to flow into the n-channel MOSFET 2 can be substantially shortened as compared with the energization time ΔT1 for which the rapidly increased drain current IMAX is allowed to flow into the n-channel MOSFET 1, because the first p-channel MOSFET 3 is only connected to the node N2 and the gate capacity of the first p-channel MOSFET 3 can be ignored although the second p-channel MOSFET 4 of a small-size element and the discharging MOSFET 54a of a large-scale element are connected to the node N1. Therefore, charge amount q2 in FIG. 12 is extremely small. When the rapidly increased drain current IMAX' furthermore increased is allowed to flow into the n-channel MOSFET 2, the charge time thereof can be furthermore shortened and the time t21 at which the first p-channel MOSFET 3 is closed, in turn the time at which the discharging MOSFET 54a is opened can be advanced. On the other hand, the drain current ID3 flowing into the discharging MOSFET 52a closed at the time 21 flows a little as a through current at the beginning, but the discharging MOSFET 54a immediately is opened as described above. Thus, the energization time of the through current is about the time interval between t2 and t21, which can be extremely shortened, so that power consumption can be suppressed as q3. The fact that the energization time of the through current can be shortened has the effect of speeding up the charge time of the gate capacity C5 although power consumption little changes even if the drain current ID3 is increased to the rapidly increased drain current IMAX. Resultantly, while power consumption is decreased by reducing the reactive current in the second n-channel MOSFET 2 and the charging MOSFET 52a, the turn-on time TON of the power p-channel MOSFET 5 at the output stage can be shortened and be balanced with the turn-off time TOFF, thus leading to an improvement in the switching speed.

After the expiration of the energization time ΔT2 of the rapidly increased drain current IMAX, the drain current variable circuit 34 rapidly decreases the drain current ID3. Since voltage regulation diode for voltage clamper is not connected to the gate G, preferably the value of the drain current ID3 is small as much as possible, and the source resistor R32 is set to high resistance. In the circuit configuration in FIG. 11, the time at which the rapidly increased, drain current IMAX of the charging MOSFET 52a starts to flow is the time t1 at which the rapidly increased drain current IMAX of the MOSFET 2 starts to flow, but a dedicated one-shot circuit, delay element, etc., may be provided for somewhat delaying the time t1. The through current of the charging MOSFET 52a can be furthermore suppressed and power consumption indicated by q3 in FIG. 12 can be eliminated substantially.

Sixth Embodiment

Figure 13:
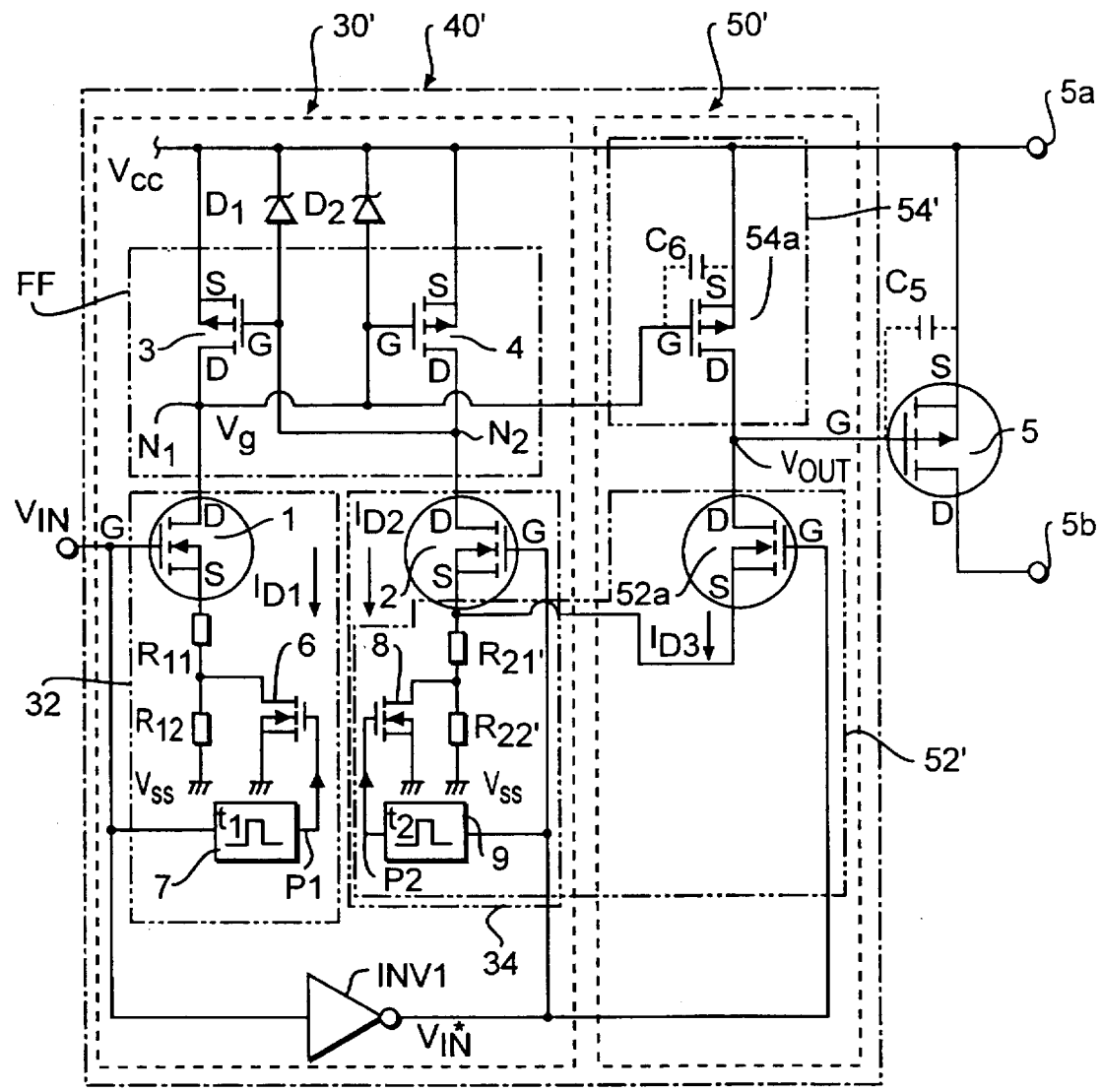
FIG. 13 is a circuit diagram to show a level shift circuit according to a sixth embodiment of the invention and its output stage transistor.

FIG. 13 is a circuit diagram to show a level shift circuit according to a sixth embodiment of the invention and its output stage transistor.

A level shift circuit 40' of the embodiment consists of a signal voltage level conversion circuit 30' and a simplified output buffer circuit 50'. A gate capacity charge circuit 52' of the output buffer circuit 50' has a high-voltage resistance n-channel MOSFET 52a for charging, opened and closed in synchronization with a second high-voltage resistance n-channel MOSFET 2 under the control of an inverted signal VIN*, source resistors R21' and R22' in series, of the signal voltage level conversion circuit 30' making up a source follower circuit (constant current circuit) together with a high-voltage resistance n-channel MOSFET 52a for charging, operating in a non-saturation region, an n-channel MOSFET 8 for changing source resistance value for short-circuiting the source resistor R22', and a one-shot circuit 9. For all of the source resistors R21' and R22', the n-channel MOSFET 8 for changing source resistance value, and the one-shot circuit 9, those of the second n-channel MOSFET 2 of the signal voltage level conversion circuit 30' are also used. The gate capacity discharge circuit 54' consists only of a p-channel MOSFET 54a for discharging, of a comparatively large element connected across the gate capacity C5 (between source and drain) and opened and closed under the control of node voltage Vg of the drain node N1 and does not comprise the voltage regulation diode D3 for diode damper shown in FIG. 11. The values of the source resistors R21' and R22' can be optimized for setting the values of a rapidly increased drain current IMAX and a power-saving current IMIN which should be allowed to flow into the second n-channel MOSFET 2 and the values of a rapidly increased drain current and a minimum current which should be allowed to flow into the high-voltage resistance n-channel MOSFET 52a for charging.

Although no voltage regulation diode D3 exists, a voltage regulation diode D2 in parallel therewith exists, so that the gate voltage of the p-channel MOSFET 54a for discharging can be clamped.

Seventh Embodiment

Figure 14:
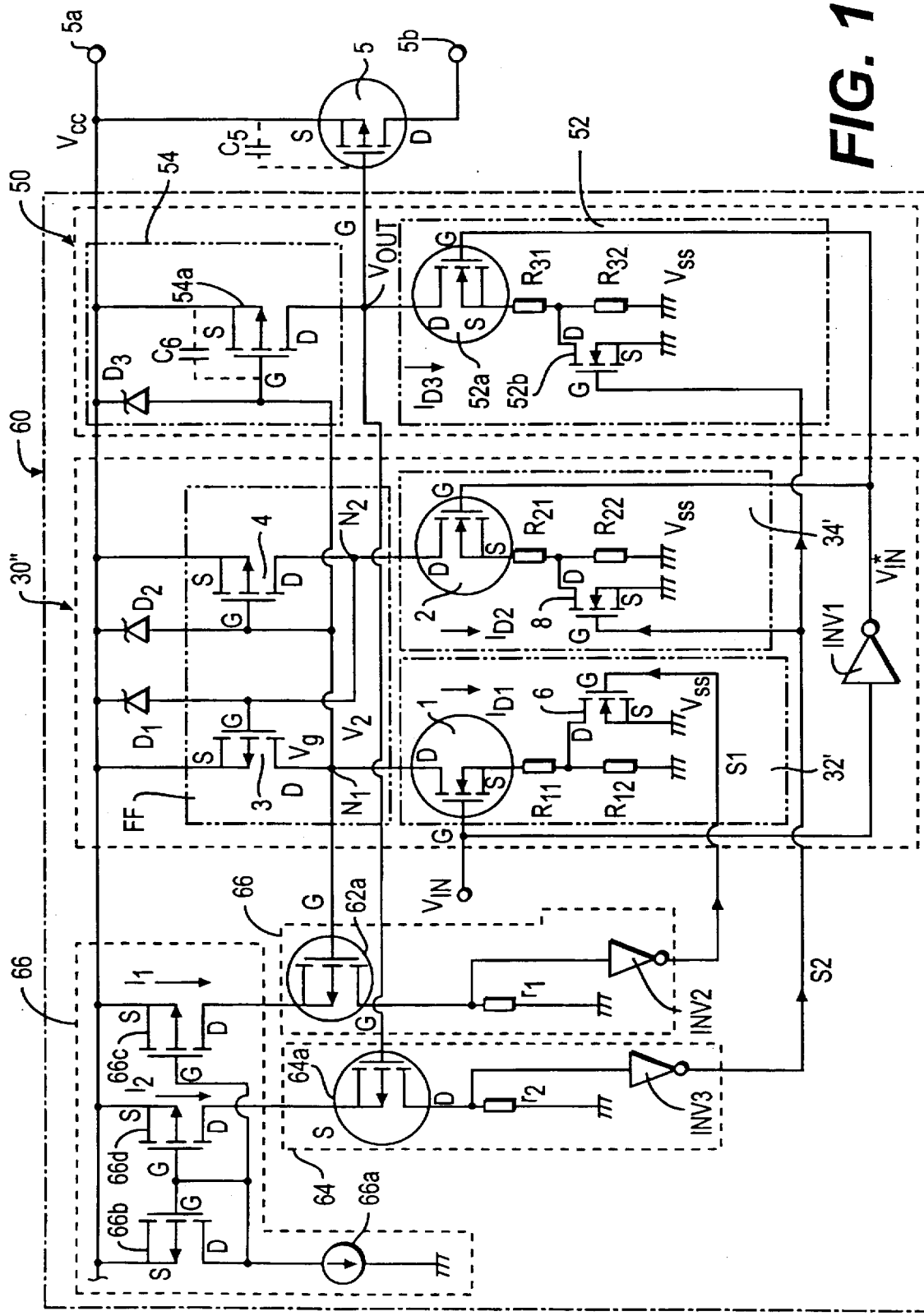
FIG. 14 is a circuit diagram to show a level shift circuit according to a seventh embodiment of the invention and its output stage transistor.

FIG. 14 is a circuit diagram to show a level shift circuit according to a third embodiment of the invention and its output stage transistor.

A level shift circuit 60 of the embodiment comprises output voltage level change detection circuits 62 and 64 in place of the one-shot circuits 7 and 9 of the drain current variable circuits 32 and 34 in the level shift circuit 40' shown in FIG. 13 and a 2-constant current source type current mirror circuit 66 of a constant current circuit for allowing constant currents I1 and I2 to flow into the output voltage level change detection circuits 62 and 64. The 2-constant current source type current mirror circuit 66 has a p-channel MOSFET 66b with gate-to-drain connection for causing a drain current to flow by a current source 66a from a Vcc power supply, a first mirror p-channel MOSFET 66c having a gate connected to the gate of the MOSFET 66b for causing the constant current I1 to flow from the Vcc power supply, and a second mirror p-channel MOSFET 66d having a gate connected to the gate of the MOSFET 66b for causing the constant current I2 to flow from the Vcc power supply.

A first output signal level change detection circuit 62 has a high-voltage resistance p-channel MOSFET 62a for detecting an output voltage rise, the MOSFET 62a being closed when the voltage of a first node N1 falls for allowing the constant current I1 to flow as a drain current, a current voltage conversion resistor r1 for allowing the constant current I1 to flow, and a CMOS inverter INV2 for inputting a voltage drop of the resistor r1 and generating a gate signal S1. Further, a second output signal level change detection circuit 64 has a high-voltage resistance p-channel MOSFET 64a for detecting an output voltage fall, the MOSFET 64a being closed when the gate voltage of a power MOSFET 5 at the output stage (output voltage VOUT) falls for allowing the constant current I2 to flow as a drain current, a current voltage conversion resistor r2 for allowing the constant current I2 to flow, and a CMOS inverter INV3 for inputting a voltage drop of the resistor r2 and generating a gate signal S2.

Figure 15:
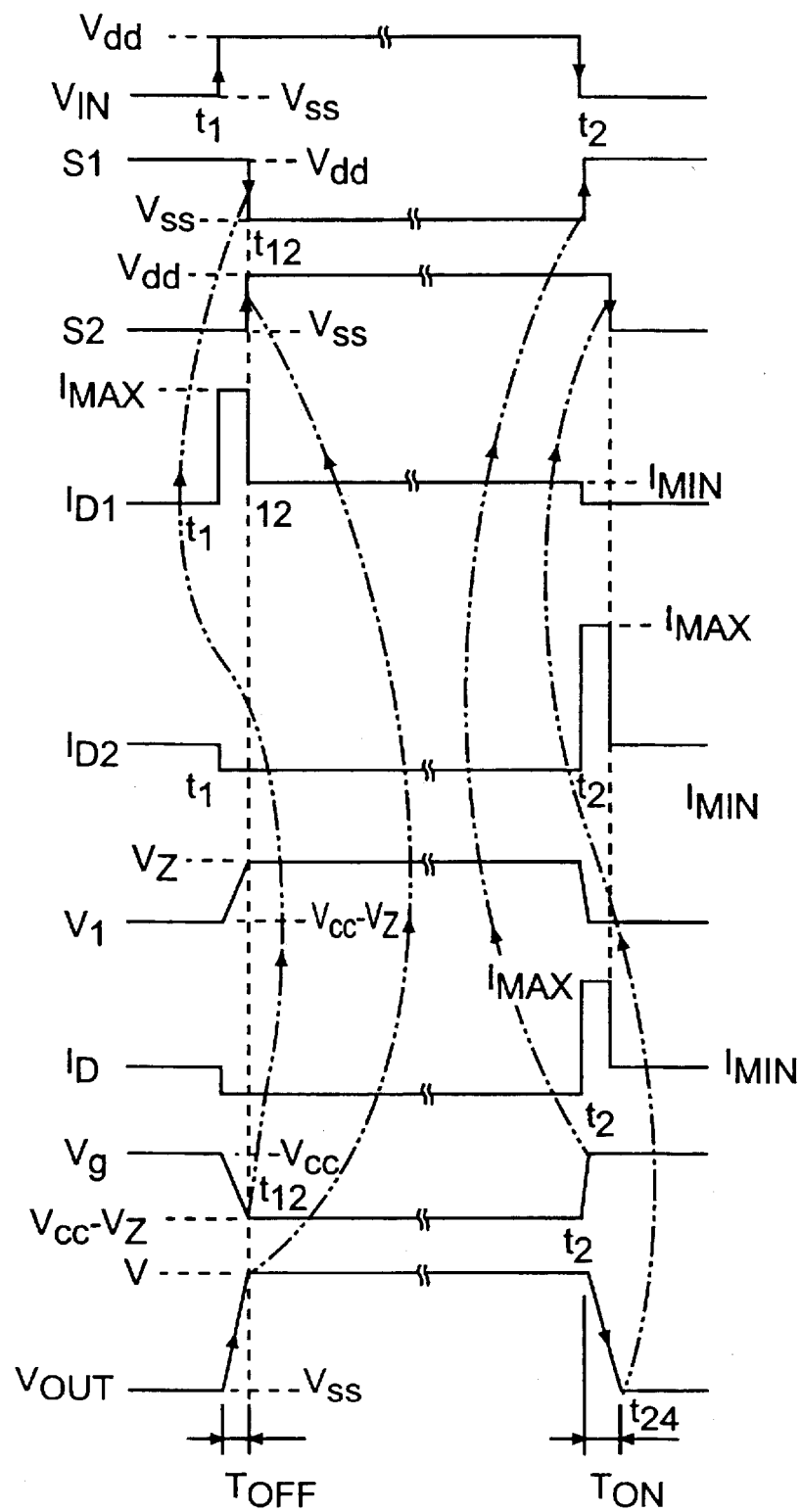
FIG. 15 is a timing chart to show waveforms of the parts of the level shift circuit in the seventh embodiment.

First, as shown in FIG. 15, just before the time t1 at which a logical input signal VIN of narrow logic amplitude rises, the voltage Vg of the node N1 is high voltage Vcc (30 V) and the output voltage VOUT is Vss (0 V), but one p-channel MOSFET 62a is open and the other p-channel MOSFET 64a is closed. Therefore, a voltage drop does not occur in one voltage conversion resistor r1, thus the output S1 of the CMOS inverter INV2 is high (3 V) and an n-channel MOSFET 6 is closed. However, since the constant current I2 causes a voltage drop to occur in the other voltage conversion resistor r2, the output S2 of the CMOS inverter INV3 is low (0 V) and n-channel MOSFETs 8 and 52b are open.

When the logical input signal VIN of narrow logic amplitude rises at the time t1 and a first n-channel MOSFET 1 is closed and a second n-channel MOSFET 2 is opened, a rapidly increased current IMAX flows as a drain current ID1 because the n-channel MOSFET 6 of a drain current variable circuit 32' is already closed, whereby the voltage Vg of the node N1 starts to fall and the output voltage VOUT starts to rise. In the transition to the rise of the output voltage VOUT, the falling edge of the voltage Vg of the node N1 of inversion output of the output voltage is monitored. When the voltage Vg falls to a value close to (Vcc−Vz), the p-channel MOSFET 62a detects it and is closed at the time t12 and a voltage drop occurs in the current voltage conversion resistor r1, causing the gate voltage S1 to go low (0 V). Thus, the n-channel MOSFET 6 is opened, whereby the drain current ID1 is changed to a power-saving current IMIN. Thus, the output voltage VOUT rises in contrast to the voltage Vg which falls. Since supply of the rapidly increased current IMAX stops at the time t12 at which the rise of the output voltage VOUT is actually complete, the supply time is not too short or long and is optimized, so that both shortening of turn-off time TOFF and reduction in power consumption can be accomplished.

When the output voltage VOUT rises at the time t12, the p-channel MOSFET 64a is opened and flowing of the constant current I2 stops. Thus, the voltage drop of the current voltage conversion resistor r2 disappears and the gate signal S2 rises, whereby the n-channel MOSFET 8 of a drain current variable circuit 34' and the n-channel MOSFET 52b of a gate capacity charge circuit 52 are closed.

Next, the second n-channel MOSFET 2 is closed at the time at which the logic input signal VIN falls, and the first n-channel MOSFET 1 is opened. At the same time, the charging MOSFET 52a is closed. Since the n-channel MOSFET 8 of the drain current variable circuit 34' and the n-channel MOSFET 52b of the gate capacity charge circuit 52 are already closed, the rapidly increased drain current IMAX flows into the second n-channel MOSFET 2 and voltage V2 of the node N2 rapidly drops. A first p-channel MOSFET 3 immediately is closed, gate capacity C6 is discharged, and a discharging MOSFET 54a is fast opened. On the other hand, the rapidly increased drain current IMAX flows into the charging MOSFET 52a, rapidly charging a gate capacity C5 of a power p-channel MOSFET 5, and the output voltage VOUT falls. In the transition to the fall of the output voltage VOUT, the falling edge of thereof is monitored at the p-channel MOSFET 64a. When the output voltage VOUT falls to a value close to Vss, the p-channel MOSFET 64a detects it and is closed at the time t24 and a voltage drop occurs in the current voltage conversion resistor r2, causing the gate voltage S2 to go low (0 V). Thus, the n-channel MOSFETs 8 and 52b are opened, whereby the drain currents ID2 and ID3 are changed to the power-saving drain current IMIN. Thus, supply of the rapidly increased drain current IMAX stops at the time t24 at which the fall of the output voltage VOUT is actually complete, so that the supply time is not too short or long and is optimized. The current variable circuit of level detection change type is thus used in the embodiment, so that both shortening of turn-on time TON and reduction in power consumption can be accomplished.

In the transition to the fall of the output voltage VOUT at the time t24, Vg already rises, thus the p-channel MOSFET 62a is opened and flowing of the constant current I1 stops. Thus, the voltage drop of the current voltage conversion resistor r1 disappears and the gate signal S1 rises, whereby the n-channel MOSFET 6 of the drain current variable circuit 32' is closed.

In the embodiment, the MOSFETs 8 and 52b are opened in synchronization with the falling edge of the gate signal S2 and the drain currents ID2 and ID3 are changed from the rapidly increased drain current IMAX to the power-saving drain current IMIN at the same time. If the time at which the drain current ID2 is changed is moved up to the time at which the gate voltage rises, power consumption can be decreased.

Eighth Embodiment

Figure 16:
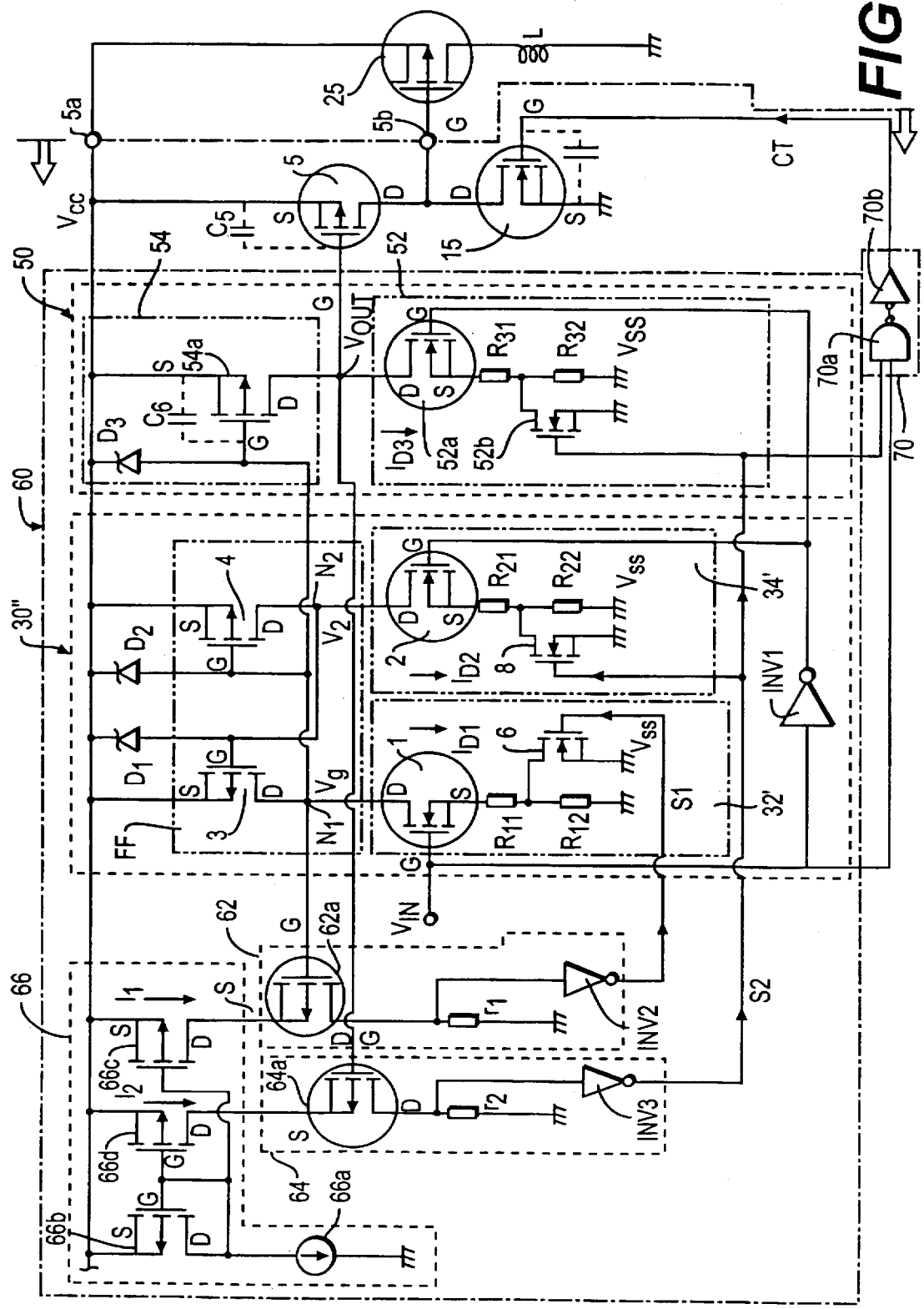
FIG. 16 is a circuit diagram to show a level shift circuit according to an eighth embodiment of the invention and its output stage transistor.

FIG. 16 is a circuit diagram to show a level shift circuit according to a seventh embodiment of the invention and its output stage transistor.

In the embodiment, a level shift circuit 60 has at the output stage a power p-channel MOSFET 5 and a power high-voltage resistance n-channel MOSFET 15 at the output stage forming a 2-stage series circuit together with the power p-channel MOSFET 5 and a gate G of a high-voltage resistance p-channel MOSFET for driving 25 is connected to an output terminal 5b connected to a common drain D to the MOSFETs 5 and 15. The gate withstand voltage of the high-voltage resistance p-channel MOSFET for driving 25 is 30 V or more, for example, for driving inductance load L of an inverter circuit. The gate of the n-channel MOSFET 15 as a complementary transistor to the p-channel MOSFET 5 is driven by an output signal CT of a closing timing circuit 70. This closing timing circuit 70 has a NAND gate 70 having two inputs of a logic input signal of narrow logic amplitude, VIN and output S2 of a CMOS inverter INV3 and an inverter 70b for inverting output of the NAND gate 70a and amplifying power.

In the embodiment, the high-voltage resistance, large-current capacity p-channel MOSFET for driving 25 is switched by a complementary gate drive system of the p-channel MOSFET 5 and the n-channel MOSFET 15. If the logic input signal VIN is applied via a buffer circuit to drive the gate of the n-channel MOSFET 15, switching control of the n-channel MOSFET 15 is enabled. However, since output voltage VOUT for driving the gate of the p-channel MOSFET 5 is formed via the level shift circuit 60, inevitably a phase delay is developed for the logic input signal VIN. If the phase delay is large, the simultaneous closing time is inserted in the complementary p-channel MOSFET 5 and n-channel MOSFET 15 to be opened/closed exclusively, thus a high through current is produced, resulting in large power consumption. To decrease it, a transmission channel of the logic input signal VIN on the side of the n-channel MOSFET 15 can be provided with a delay circuit. However, the delay amount of the delay circuit is determined strictly as an estimated amount. In fact, the simultaneous closing time is inserted due to semiconductor device manufacturing variations, etc., and a through current that cannot be ignored occurs.

In the embodiment, however, as shown in FIG. 16, if the logic input signal VIN is low, a rapidly increased drain current IMIN of a gate capacity charge circuit 52 causes output voltage VOUT to promptly drop, turning on the p-channel MOSFET 5. When the p-channel MOSFET 5 is closed, the output voltage VOUT is low, thus the output S2 of the CMOS inverter INV3 of an output voltage level change detection circuit 64 is also low. So long as the output S2 is low, if the logic input signal VIN goes high fast, output of the NAND gate 70a remains high and the n-channel MOSFET 15 is not closed. The n-channel MOSFET 15 is not closed until the output S2 goes high and the p-channel MOSFET 5 is turned off. Therefore, the simultaneous closing time when the p-channel MOSFET 5 is turned off and the n-channel MOSFET 15 is turned on does not occur and the through current can be eliminated. When the n-channel MOSFET 15 is turned off and the p-channel MOSFET 5 is turned on, the n-channel MOSFET 15 is opened directly under the control of the input signal VIN, thus is opened fast, so that no through current occurs.

In the embodiments, the p-channel MOSFETs 3 and 4 make up the flip-flop FF and the pull-down MOSFETs 3 and 4 for writing a potential into the storage nodes N1 and N2 are n-channel MOSFETs. In contrast, n-channel MOSFETs may make up the flip-flop FF and pull-up MOSFETs for writing a potential into the storage nodes N1 and N2 may be p-channel MOSFETs.

In the embodiments, the low and high voltages of the logic input signal VIN of narrow logic amplitude, Vss and Vdd, are 0 V and 3 V respectively and the low and high voltages of the logic output VOUT of wide logic amplitude, VOUT and Vss, are 0 V and 30 V respectively. However, in the invention, assuming that the low voltage of the logic output VOUT of wide logic amplitude is Vee, the relation "low voltage source (Vdd–Vss) <high voltage source (Vcc–Vee)" needs only to be satisfied. In the embodiments, the relation Vss=Vee<Vdd<Vcc is simply applied. The relations Vee<Vcc≦Vss<Vdd, Vee<Vss<Vcc≦Vdd, Vss≦Vee<Vdd≦Vcc, and Vss<Vdd≦Vee<Vcc are also contained, needless to say.

If the on resistance values of the MOSFETs 6, 8, and 52a are set equal to the values of the resistors R11, R21, and R31, the resistors R11, R21, and R31 can be omitted.

Further, not only monopolar transistors such as MOSFETs (metal oxide semiconductor field effect transistors), but also bipolar transistors may be used to make up the level shift circuit.

As we have discussed, in the level shift circuits of the first to fourth embodiments, to operate the operation object such as a power semiconductor device connected to the high-voltage side power supply voltage by the low-voltage input signal, the level shift circuit of the invention comprises the first and second operation circuits each having low-voltage and high-voltage transistors connected in series, the bias means provided in a one-to-one correspondence with the operation circuits and connected to the low-voltage transistors of the operation circuits in series, and the current control means provided accompanying the bias means in a one-to-one correspondence, whereby the low-voltage transistors of both the operation circuits are controlled on and off alternately in response to the logic state of the input signal as an operation command for the operation object, the on/off state of the high-voltage transistor of each operation circuit is controlled according to the potential at the interconnection point between the low-voltage and high-voltage transistors of the opposite operation circuit, and the operation object for receiving the high-voltage side power supply voltage is turned on/off according to the potential at the interconnection point between the low-voltage and high-voltage transistors of one operation circuit, whereby the following effects can be produced:

(a) The low-voltage transistor to which the bias means is connected operates in an active state as a source follower or an emitter follower and the current flowing into the transistor is decreased to a low level in the stationary on state. Thus, power consumption of both the operation circuits and therefore the level shift circuit can be decreased to the extent that can be ignored on practical use.

(b) The, current flowing into the low-voltage transistor operating as a source follower or an emitter follower can be set precisely according to the operation threshold value on the input side and the resistance value of the bias means and is little affected by the value of the high-voltage side power supply voltage received by the operation circuit or change of the voltage value. Thus, while the range of the high-voltage side power supply voltages to which the level shift circuit can be applied can be widened, power consumption of the level shift circuit can be reliably suppressed to the allowable limit or less.

(c) In the transient state just after the low-voltage transistor of the operation circuit is turned on, the current flowing into the transistor can be drastically increased only within a short time by the current control means for exceptionally raising the operation speed for the operation object than was previously possible, and the peak current value in the transient state is determined by constants of the circuit elements making up the current control means, etc., thus the operation speed can be set precisely in response to a desired value.

The embodiment wherein when the low-voltage transistor in the operation circuit is a MOS transistor, a source resistor is connected as the bias means for the level shift circuit of the invention or wherein when the low-voltage transistor is a bipolar transistor, an emitter resistor is connected as the bias means has the effects of making up the bias means of simple circuit elements and decreasing the stationary current flowing into the low-voltage transistor which is operated as a source follower or an emitter follower.

The form using a capacitor as the current control means has the advantage that it can simplify the circuit configuration. The form with a series resistor connected to a capacitor has the advantage that the peak current to be allowed to flow into the low-voltage transistor can be set precisely according to the resistance value of the series resistor. The form wherein a short-circuit transistor is connected to the capacitor in parallel and is turned on when the corresponding low-voltage transistor is off has the effect of accelerating the operation speed for the operation object. The form wherein a short-circuit transistor as the current control means is connected to at least a part of the bias means in parallel and is turned on only within a short time just after the low-voltage transistor is turned on has the effect of furthermore accelerating the operation speed for the operation object. The form wherein a one-shot circuit is used as means for turning on the short-circuit transistor only within the short time has the effect of precisely setting the time for which the peak current should be allowed to flow into the low-voltage transistor by turning on the short-circuit transistor.

The form wherein the peak current allowed to flow into the low-voltage transistor of the operation circuit for giving operation potential to the operation object is set by the current control means larger than the peak current allowed to flow into the low-voltage transistor of the opposite operation circuit has the advantage that the drive circuit for the operation object and the floating power supply for the drive circuit can be omitted.

The form wherein a high resistor is connected to the high-voltage transistor of the operation circuit in parallel has the advantage that the current allowed to flow into the low-voltage transistor can be stabilized. The form wherein a Zener diode is connected to the gate and emitter of the high-voltage transistor has the advantage that the high-voltage transistor can be protected for improving reliability of the operation. The form wherein the Zener diode is designed to cause Zener breakdown when the high-voltage transistor is on has the effect of omitting the above-mentioned high resistor.

As we have discussed, the level shift circuit according to the fifth to eighth embodiments is characterized by the fact that it is provided with the discharge transistor opened and closed based on the voltage of either of the storage nodes and the charge transistor opened and closed under the control of logic input or its inverted input in order to charge and discharge the capacity parasitic on the control terminal of the output-stage transistor apart from the first and second second conductive transistors making up the flip-flop. Therefore, the following effects are produced:

(1) Since neither of the storage nodes are connected to the control terminal of the second conductive transistor at the output stage, the discharge transistor is not affected by the parasitic capacity on the control terminal and is opened fast. Thus, the current produced by the charge transistor is hard to flow as a through current and the parasitic capacity on the control terminal can be charged rapidly. Therefore, the switching speed of the second conductive transistor at the output stage can be made high. Since the through current lessens, power consumption can be decreased.

(2) In the level shift circuit comprising diode clampers connected between the first and second storage nodes and the high-voltage power supply, the element withstand voltage of the transistors making up the flip-flop, etc., can be made low.

(3) In the level shift circuit comprising the current variable circuits, the rapidly increased current causes the state transition of the flip-flop to be speeded up, contributing to an improvement in the switching speed. At the same time, the opening operation of the discharge transistor is accelerated, so that the period of the through current via the discharge transistor is shortened and power consumption is furthermore decreased.

(4) Particularly, according to the level shift circuit using the level detection change type current variable circuits as the current variable circuits, the rapidly increased current period is, not too long or short and the rapidly increased current can be allowed to flow only for the optimum time, thus speeding up the state transition operation and low power consumption can be accomplished at the same time.

(5) When the semiconductor integrated circuit having the first conductive transistor at the output stage forming the complementary drive system of the output terminal together with the second conductive transistor at the output stage is provided with the closing timing circuit using output level detection signals of the level detection change type current variable circuits to inhibit the first and second conductive transistors at the output stage from being closed simultaneously, the first conductive transistor at the output stage is not closed until the second conductive transistor at the output stage is actually opened. Thus, the through current at the output stage can be eliminated and power consumption can be made low drastically.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A level shift circuit for operating a high-voltage operation object by a low-voltage input signal, comprising:

first and second operation circuits each having low-voltage and high-voltage transistors connected in series for controlling an on/off state of the high-voltage transistor of each operation circuit according to a potential at an interconnection point between the low-voltage and high-voltage transistors of opposite ones of the first and second operation circuits;

bias means being provided in a one-to-one correspondence with said first and second operation circuits and being connected to the low-voltage transistors of said first and second operation circuits in series for activating the corresponding transistors in a stationary on state to decrease currents flowing into the corresponding transistors; and current control means being provided in a one-to-one correspondence with said bias means for increasing currents flowing into the corresponding low-voltage transistors when the transistors make an off-to-on state transition, so that the low-voltage transistors of both said first and second operation circuits are controlled on/off alternately in response to a state of the input signal and the high-voltage operation object is turned on/off according to the potential at the interconnection point between the low-voltage and high-voltage transistors of one of the first and second operation circuits.

2. The level shift circuit as claimed in claim 1 wherein a MOS transistor is used as the low-voltage transistor in said first and second operation circuits and wherein a source resistor is connected as bias means for the low-voltage transistor.

3. The level shift circuit as claimed in claim 1 wherein a bipolar transistor is used as the low-voltage transistor in said first and second operation circuits and wherein an emitter resistor is connected as bias means for the low-voltage transistor.

4. The level shift circuit as claimed in claim 1 wherein a capacitor is connected to said bias means in parallel as said current control means.

5. The level shift circuit as claimed in claim 4 wherein a series resistor is connected to said capacitor.

6. The level shift circuit as claimed in claim 4 wherein a short-circuit transistor is connected to said capacitor in parallel and is turned on when the corresponding low-voltage transistor is off.

7. The level shift circuit as claimed in claim 1 wherein a short-circuit transistor as said current control means is connected to at least a part of a resistor as said bias means in parallel and wherein when the corresponding low-voltage transistor makes the off-to-on state transition, said short-circuit transistor is turned on only within a predetermined short time.

8. The level shift circuit as claimed in claim 7 wherein a one-shot circuit is used as means for turning on said short-circuit transistor only within the predetermined short time and wherein an input signal or a complementary signal to the input signal is given to said one-shot circuit for operating said one-shot circuit in response to the logical state transition of the signal.

9. The level shift circuit as claimed in claim 1 wherein said current control means of one of said first and second operation circuits for giving operation potential to the operation object increases an on current of the corresponding low-voltage transistor larger than that in an opposite one of said first and second operation circuits.

10. The level shift circuit as claimed in claim 1 wherein a high resistor is connected to the high-voltage transistor of said first and second operation circuits in parallel.

11. The level shift circuit as claimed in claim 1 wherein the high-voltage transistor of said first and second operation circuits is a MOS transistor and wherein a Zener diode is connected between a gate of the MOS transistor and a source for receiving a power supply voltage in parallel.

12. The level shift circuit as claimed in claim 11 wherein the Zener diode is designed to cause Zener breakdown when the high-voltage transistor is on.

13. A level shift circuit comprising:

a signal voltage level conversion circuit having a first first conductive transistor opened and closed under control of a logic input of narrow logic amplitude produced by a low-voltage power supply, a second first conductive transistor opened and closed exclusively with the first first conductive transistor under control of an inverted input of an opposite phase to that of the logic input, a first second conductive transistor connected to the first first conductive transistor in series between high-voltage power supplies and closed when the second first conductive transistor is closed, and a second second conductive transistor connected to the second first conductive transistor in series between the high-voltage power supplies and closed when the first first conductive transistor is closed, said first and second second conductive transistors making up a flip-flop via first and second storage nodes;

a capacity discharge circuit having a discharge transistor opened and closed based on a voltage of either of the storage nodes for discharging a capacity parasitic on a control terminal of a third conductive transistor at an output stages;

a capacity charge circuit having a charge transistor opened and closed based on the logic input or the inverted input for charging the capacity; and current variable circuits for causing a rapidly increased current to flow into the first and second first conductive transistors and the charge transistor in a level transition period of the logic input and then lowering to a low current.

14. The level shift circuit as claimed in claim 13 further including diode dampers connected between the first and second storage nodes and the high-voltage power supply.

15. The level shift circuit as claimed in claim 13 wherein said current variable circuits are time limit change type current variable circuits for changing the rapidly increased current to a low current in a predetermined uniform time after the level transition of the logic input.

16. The level shift circuit as claimed in claim 13 wherein said current variable circuits are level detection change type current variable circuits for detecting level transition end of an output voltage appearing on the control terminal of the third conductive transistor at the output stage and changing the rapidly increased current to a low current.

17. The level shift circuit as claimed in claim 16 further including a fourth conductive transistor at the output stage forming a complementary drive system of an output terminal together with said third conductive transistor at the output stage and a closing timing circuit using output level detection signals of said level detection change type current variable circuits to inhibit said third and fourth conductive transistors at the output stage from being closed simultaneously.

* * * * *

UNITED STATES PATENT AND TRADEMARK OFFICE
CERTIFICATE OF CORRECTION

PATENT NO.   : 5,896,043
DATED        : April 20, 1999
INVENTOR(S)  : KUMAGAI

It is certified that error appears in the above-identified patent and that said Letters Patent is hereby corrected as shown below:

Title page, item [30], under "Foreign Application Priority Data", "Feb. 10, 1989" should read --Feb. 8, 1996--.

Claim 13, column 28, line 17, "stages" should read --stage--.

Signed and Sealed this

Eighth Day of February, 2000

*Attest:*

*Attesting Officer*

Q. TODD DICKINSON

*Commissioner of Patents and Trademarks*